US010876833B2

(12) United States Patent
Biskeborn

(10) Patent No.: US 10,876,833 B2
(45) Date of Patent: Dec. 29, 2020

(54) APPARATUS AND METHOD FOR MEASURING MICROMETER SCALE FEATURES OF ELECTRONIC COMPONENT OVER MILLIMETER SCALE DISTANCES TO NANOMETER SCALE PRECISION

(71) Applicant: International Business Machines Corporation, Armonk, NY (US)

(72) Inventor: Robert G. Biskeborn, Hollister, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/936,171

(22) Filed: Mar. 26, 2018

(65) Prior Publication Data

US 2019/0293418 A1   Sep. 26, 2019

(51) Int. Cl.
*H01J 37/20* (2006.01)
*H01J 37/28* (2006.01)
*G01B 21/16* (2006.01)
*G01B 15/00* (2006.01)
*G01Q 60/50* (2010.01)
*G01B 11/14* (2006.01)
*G01Q 60/24* (2010.01)
*G11B 5/008* (2006.01)

(52) U.S. Cl.
CPC ............. *G01B 21/16* (2013.01); *G01B 11/14* (2013.01); *G01B 15/00* (2013.01); *G01Q 60/24* (2013.01); *G01Q 60/50* (2013.01); *H01J 37/20* (2013.01); *G11B 5/00813* (2013.01); *H01J 37/28* (2013.01)

(58) Field of Classification Search
CPC ....... H01J 37/20; H01J 37/28; H01J 2237/202; H01J 2237/20221; H01J 2237/20228; G01Q 10/04; G01B 21/16
See application file for complete search history.

(56) References Cited

U.S. PATENT DOCUMENTS

| 5,139,383 | A | * | 8/1992 | Polyak ................... H01J 37/20 294/116 |
| 6,481,003 | B1 |  | 11/2002 | Maeda |
| 6,867,412 | B2 |  | 3/2005 | Patzwald et al. |
| 7,274,471 | B2 |  | 9/2007 | Shin et al. |
| 8,654,195 | B2 |  | 2/2014 | Ishiyama et al. |
| 9,159,119 | B2 |  | 10/2015 | Shechtman et al. |
| 9,265,414 | B2 |  | 2/2016 | Wilson et al. |
| 2008/0196631 | A1 | * | 8/2008 | Kosmowski .......... B23K 26/02 108/20 |
| 2011/0304241 | A1 | * | 12/2011 | Voigtlaender ......... B82Y 35/00 310/323.02 |
| 2013/0099134 | A1 | * | 4/2013 | Sun ........................ H01J 37/20 250/440.11 |

(Continued)

FOREIGN PATENT DOCUMENTS

KR   20070117937 A   12/2007

*Primary Examiner* — Eliza W Osenbaugh-Stewart
(74) *Attorney, Agent, or Firm* — Zilka-Kotab, P.C.

(57) ABSTRACT

In one general embodiment, an apparatus for moving a sample a precise distance in an imaging device includes a base, and a movable portion positioned above the base and configured to move relative to the base. An extent of motion of the movable portion is constrained by stops. The extent of motion is within 10 nm of a predefined distance of greater than 1 mm. Additional apparatuses and methods are also presented.

20 Claims, 15 Drawing Sheets (a)   (b)

(56) References Cited

U.S. PATENT DOCUMENTS

2016/0005568 A1* 1/2016 Mizuochi ................ H01J 37/20
250/442.11
2018/0076368 A1* 3/2018 Hussell .................. H01L 33/62

* cited by examiner

APPARATUS AND METHOD FOR MEASURING MICROMETER SCALE FEATURES OF ELECTRONIC COMPONENT OVER MILLIMETER SCALE DISTANCES TO NANOMETER SCALE PRECISION

BACKGROUND

The present invention relates to measurement of features of magnetic tape head modules and other small objects, and more particularly, this invention relates to an apparatus and method for measuring such small objects to nanometer scale precision.

In magnetic storage systems, magnetic transducers read data from and write data onto magnetic recording media. Data is written on the magnetic recording media by moving a magnetic recording transducer to a position over the media where the data is to be stored. The magnetic recording transducer then generates a magnetic field, which encodes the data into the magnetic media. Data is read from the media by similarly positioning the magnetic read transducer and then sensing the magnetic field of the magnetic media. Read and write operations may be independently synchronized with the movement of the media to ensure that the data can be read from and written to the desired location on the media.

An important and continuing goal in the data storage industry is that of increasing the density of data stored on a medium. For tape storage systems, that goal has led to increasing the track and linear bit density on recording tape, and decreasing the thickness of the magnetic tape medium. However, the development of small footprint, higher performance tape drive systems has created various problems in the design of a tape head assembly for use in such systems.

In a tape drive system, the drive moves the magnetic tape over the surface of the tape head at high speed. Usually the tape head is designed to minimize the spacing between the head and the tape. The spacing between the magnetic head and the magnetic tape is crucial and so goals in these systems are to have the recording gaps of the transducers, which are the source of the magnetic recording flux in near contact with the tape to effect writing sharp transitions, and to have the read elements in near contact with the tape to provide effective coupling of the magnetic field from the tape to the read elements.

SUMMARY

An apparatus for moving a sample a precise distance in an imaging device, according to one embodiment, includes a base, and a movable portion positioned above the base and configured to move relative to the base. An extent of motion of the movable portion is constrained by stops. The extent of motion is within 10 nm of a predefined distance of greater than 1 mm.

A method for measuring a distance between features of a sample, according to one embodiment, includes positioning an apparatus for moving a sample a precise distance on a stage of an imaging device. The apparatus includes a base and a movable portion positioned above the base, the movable portion being configured to move along the base. An extent of motion of the movable portion is constrained by stops, where the extent of motion is within 10 nm of a predefined distance of greater than 1 mm. The method also includes positioning the sample on the movable portion of the apparatus. A first image of a first feature of the sample is generated using the imaging device when the movable portion is abutting a first of the stops. The movable portion is then moved to a second of the stops, and a second image of a second feature of the sample is generated using the imaging device. A distance between the first feature and the second feature is computed based on the images.

A method for measuring a distance between features of a sample, according to one embodiment, includes positioning a sample on a movable portion of an apparatus. A first image of a first feature of the sample is generated using an imaging device when the movable portion is in a first position. The movable portion is moved to a second position a precise distance from the first position, and a second image of a second feature of the sample is generated using the imaging device when the movable portion is in the second position. A distance between the first feature and the second feature is computed based on the images.

Any of these embodiments may be implemented in a magnetic data storage system such as a tape drive system, which may include a magnetic head, a drive mechanism for passing a magnetic medium (e.g., recording tape) over the magnetic head, and a controller electrically coupled to the magnetic head.

Other aspects and embodiments of the present invention will become apparent from the following detailed description, which, when taken in conjunction with the drawings, illustrate by way of example the principles of the invention.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of measurement of features of magnetic tape head modules and other small objects, as well as apparatus and methods for measuring such small objects to nanometer scale precision.

In one general embodiment, an apparatus for moving a sample a precise distance in an imaging device includes a base, and a movable portion positioned above the base and configured to move relative to the base. An extent of motion of the movable portion is constrained by stops. The extent of motion is within 10 nm of a predefined distance of greater than 1 mm.

In another general embodiment, a method for measuring a distance between features of a sample includes positioning an apparatus for moving a sample a precise distance on a stage of an imaging device. The apparatus includes a base and a movable portion positioned above the base, the movable portion being configured to move along the base. An extent of motion of the movable portion is constrained by stops, where the extent of motion is within 10 nm of a predefined distance of greater than 1 mm. The method also includes positioning the sample on the movable portion of the apparatus. A first image of a first feature of the sample is generated using the imaging device when the movable portion is abutting a first of the stops. The movable portion is then moved to a second of the stops, and a second image of a second feature of the sample is generated using the imaging device. A distance between the first feature and the second feature is computed based on the images.

In yet another general embodiment, a method for measuring a distance between features of a sample includes positioning a sample on a movable portion of an apparatus. A first image of a first feature of the sample is generated using an imaging device when the movable portion is in a first position. The movable portion is moved to a second position a precise distance from the first position, and a second image of a second feature of the sample is generated using the imaging device when the movable portion is in the second position. A distance between the first feature and the second feature is computed based on the images.

Figure 1A:
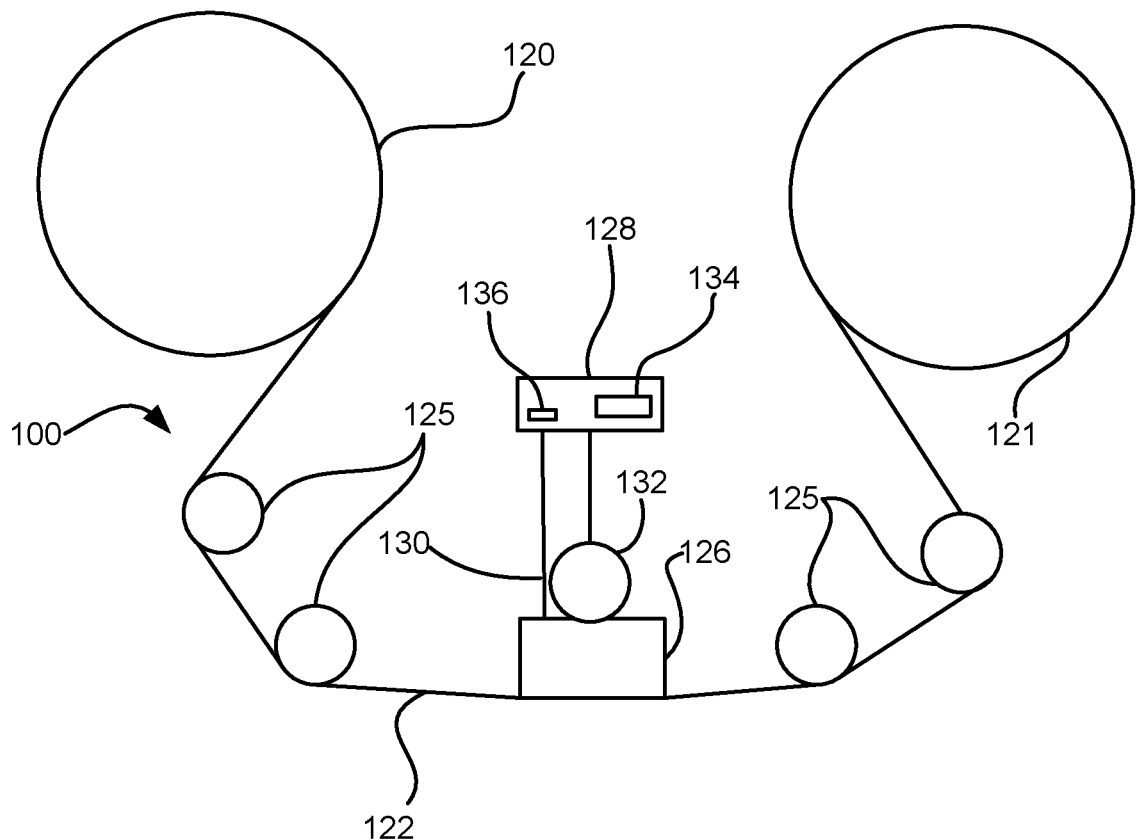
FIG. 1A is a schematic diagram of a simplified tape drive system according to one embodiment.

FIG. 1A illustrates a simplified tape drive 100 of a tape-based data storage system, which may be employed in the context of the present invention. While one specific implementation of a tape drive is shown in FIG. 1A, it should be noted that the embodiments described herein may be implemented in the context of any type of tape drive system.

As shown, a tape supply cartridge 120 and a take-up reel 121 are provided to support a tape 122. One or more of the reels may form part of a removable cartridge and are not necessarily part of the system 100. The tape drive, such as that illustrated in FIG. 1A, may further include drive motor(s) to drive the tape supply cartridge 120 and the take-up reel 121 to move the tape 122 over a tape head 126 of any type. Such head may include an array of readers, writers, or both.

Guides 125 guide the tape 122 across the tape head 126. Such tape head 126 is in turn coupled to a controller 128 via a cable 130. The controller 128, may be or include a processor and/or any logic for controlling any subsystem of the drive 100. For example, the controller 128 typically controls head functions such as servo following, data writing, data reading, etc. The controller 128 may include at least one servo channel and at least one data channel, each of which include data flow processing logic configured to process and/or store information to be written to and/or read from the tape 122. The controller 128 may operate under logic known in the art, as well as any logic disclosed herein, and thus may be considered as a processor for any of the descriptions of tape drives included herein, in various embodiments. The controller 128 may be coupled to a memory 136 of any known type, which may store instructions executable by the controller 128. Moreover, the controller 128 may be configured and/or programmable to perform or control some or all of the methodology presented herein. Thus, the controller 128 may be considered to be configured to perform various operations by way of logic programmed into one or more chips, modules, and/or blocks; software, firmware, and/or other instructions being available to one or more processors; etc., and combinations thereof.

The cable 130 may include read/write circuits to transmit data to the head 126 to be recorded on the tape 122 and to receive data read by the head 126 from the tape 122. An actuator 132 controls position of the head 126 relative to the tape 122.

An interface 134 may also be provided for communication between the tape drive 100 and a host (internal or external) to send and receive the data and for controlling the operation of the tape drive 100 and communicating the status of the tape drive 100 to the host, all as will be understood by those of skill in the art.

Figure 1B:
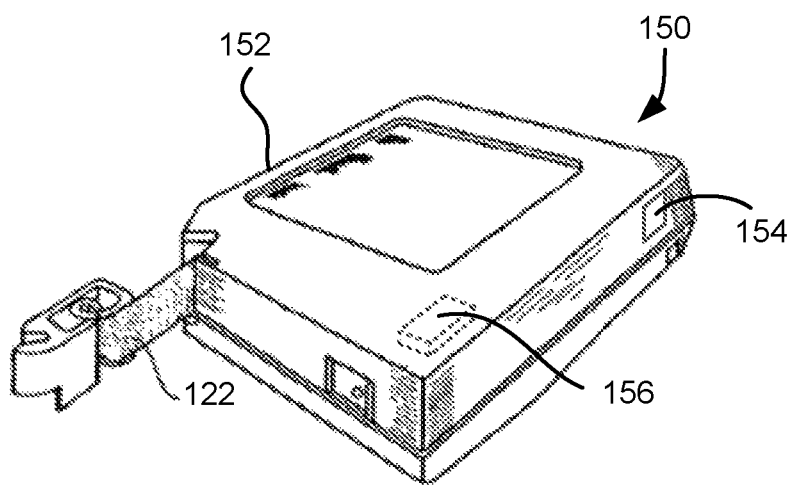
FIG. 1B is a schematic diagram of a tape cartridge according to one embodiment.

FIG. 1B illustrates an exemplary tape cartridge 150 according to one embodiment. Such tape cartridge 150 may be used with a system such as that shown in FIG. 1A. As shown, the tape cartridge 150 includes a housing 152, a tape 122 in the housing 152, and a nonvolatile memory 156 coupled to the housing 152. In some approaches, the nonvolatile memory 156 may be embedded inside the housing 152, as shown in FIG. 1B. In more approaches, the nonvolatile memory 156 may be attached to the inside or outside of the housing 152 without modification of the housing 152. For example, the nonvolatile memory may be embedded in a self-adhesive label 154. In one preferred embodiment, the nonvolatile memory 156 may be a Flash memory device, read-only memory (ROM) device, etc., embedded into or coupled to the inside or outside of the tape cartridge 150. The nonvolatile memory is accessible by the tape drive and the tape operating software (the driver software), and/or another device.

Figure 2A:
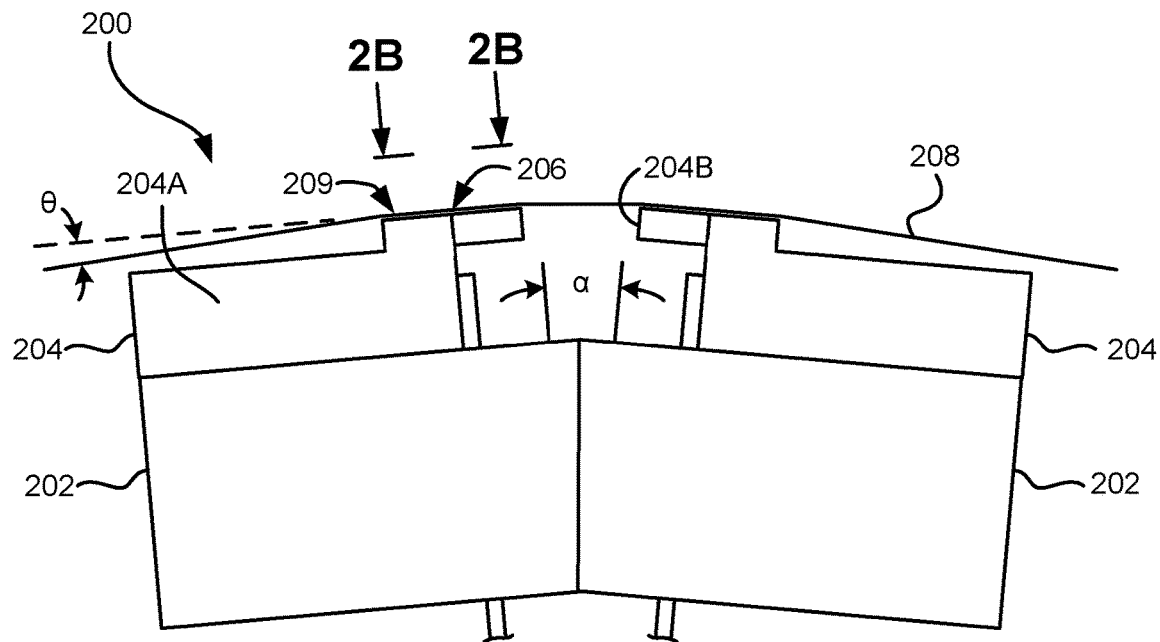
FIG. 2A illustrates a side view of a flat-lapped, bi-directional, two-module magnetic tape head according to one embodiment.

By way of example, FIG. 2A illustrates a side view of a flat-lapped, bi-directional, two-module magnetic tape head 200 which may be implemented in the context of the present invention. As shown, the head includes a pair of bases 202, each equipped with a module 204, and fixed at a small angle α with respect to each other. The bases may be "U-beams" that are adhesively coupled together. Each module 204 includes a substrate 204A and a closure 204B with a thin film portion, commonly referred to as a "gap" in which the readers and/or writers 206 are formed. In use, a tape 208 is moved over the modules 204 along a media (tape) bearing surface 209 in the manner shown for reading and writing data on the tape 208 using the readers and writers. The wrap angle θ of the tape 208 at edges going onto and exiting the flat media support surfaces 209 are usually between about 0.1 degree and about 3 degrees.

The substrates 204A are typically constructed of a wear resistant material, such as a ceramic. The closures 204B may be made of the same or similar ceramic as the substrates 204A.

The readers and writers may be arranged in a piggyback or merged configuration. An illustrative piggybacked configuration comprises a (magnetically inductive) writer transducer on top of (or below) a (magnetically shielded) reader transducer (e.g., a magnetoresistive reader, etc.), wherein the poles of the writer and the shields of the reader are generally separated. An illustrative merged configuration comprises one reader shield in the same physical layer as one writer pole (hence, "merged"). The readers and writers may also be arranged in an interleaved configuration. Alternatively, each array of channels may be readers or writers only. Any of these arrays may contain one or more servo track readers for reading servo data on the medium.

Figure 2B:
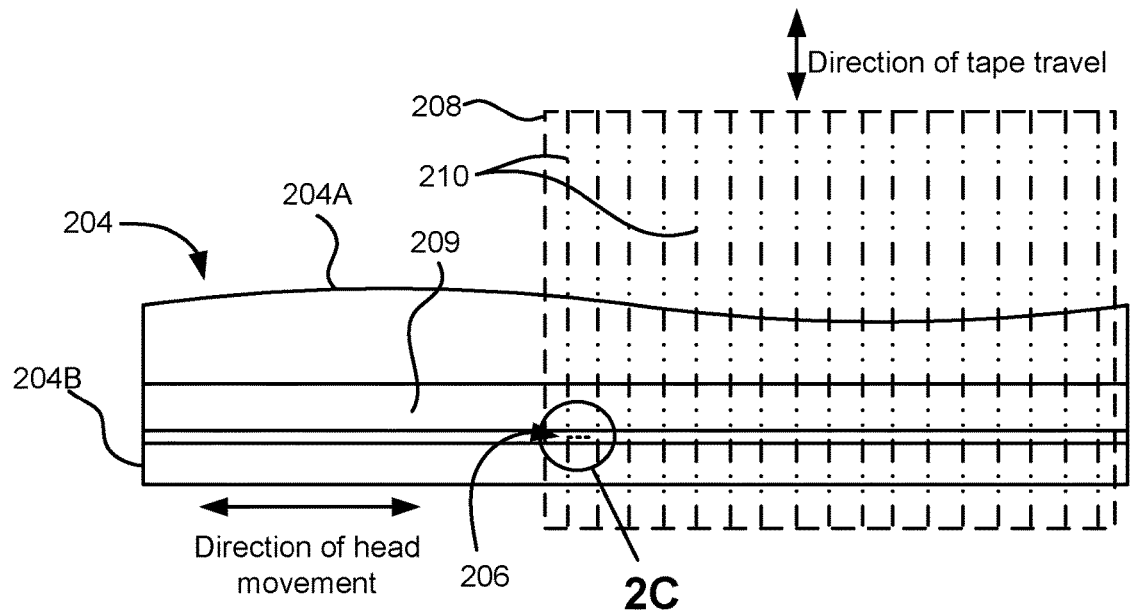
FIG. 2B is a tape bearing surface view taken from Line 2B of FIG. 2A.

FIG. 2B illustrates the tape bearing surface 209 of one of the modules 204 taken from Line 2B of FIG. 2A. A representative tape 208 is shown in dashed lines. The module 204 is preferably long enough to be able to support the tape as the head steps between data bands.

In this example, the tape 208 includes 4 to 32 data bands, e.g., with 16 data bands and 17 servo tracks 210, as shown in FIG. 2B on a one-half inch wide tape 208. The data bands are defined between servo tracks 210. Each data band may include a number of data tracks, for example 1024 data tracks (not shown). During read/write operations, the readers and/or writers 206 are positioned to specific track positions within one of the data bands. Outer readers, sometimes called servo readers, read the servo tracks 210. The servo signals are in turn used to keep the readers and/or writers 206 aligned with a particular set of tracks during the read/write operations.

Figure 2C:
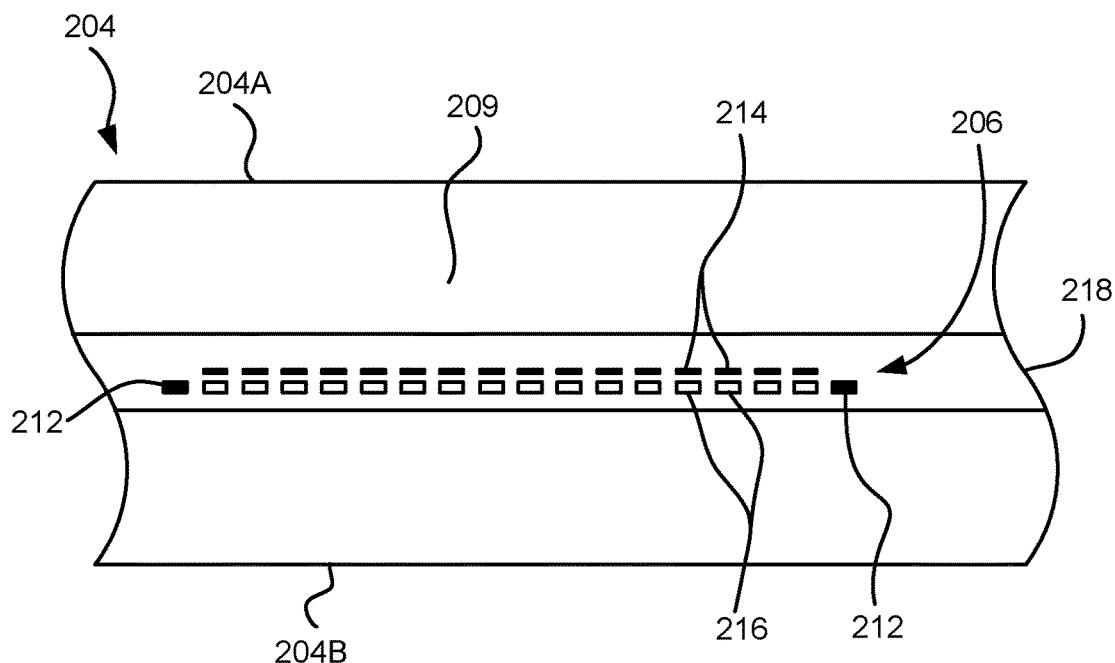
FIG. 2C is a detailed view taken from Circle 2C of FIG. 2B.

FIG. 2C depicts a plurality of readers and/or writers 206 formed in a gap 218 on the module 204 in Circle 2C of FIG. 2B. As shown, the array of readers and writers 206 includes, for example, 16 writers 214, 16 readers 216 and two servo readers 212, though the number of elements may vary. Illustrative embodiments include 8, 16, 32, 40, and 64 active readers and/or writers 206 per array, and alternatively interleaved designs having odd numbers of reader or writers such as 17, 25, 33, etc. An illustrative embodiment includes 32 readers per array and/or 32 writers per array, where the actual number of transducer elements could be greater, e.g., 33, 34, etc. This allows the tape to travel more slowly, thereby reducing speed-induced tracking and mechanical difficulties and/or execute fewer "wraps" to fill or read the tape. While the readers and writers may be arranged in a piggyback configuration as shown in FIG. 2C, the readers 216 and writers 214 may also be arranged in an interleaved configuration. Alternatively, each array of readers and/or writers 206 may be readers or writers only, and the arrays may contain one or more servo readers 212. As noted by considering FIGS. 2A and 2B-2C together, each module 204 may include a complementary set of readers and/or writers 206 for such things as bi-directional reading and writing, read-while-write capability, backward compatibility, etc.

Figure 2D:
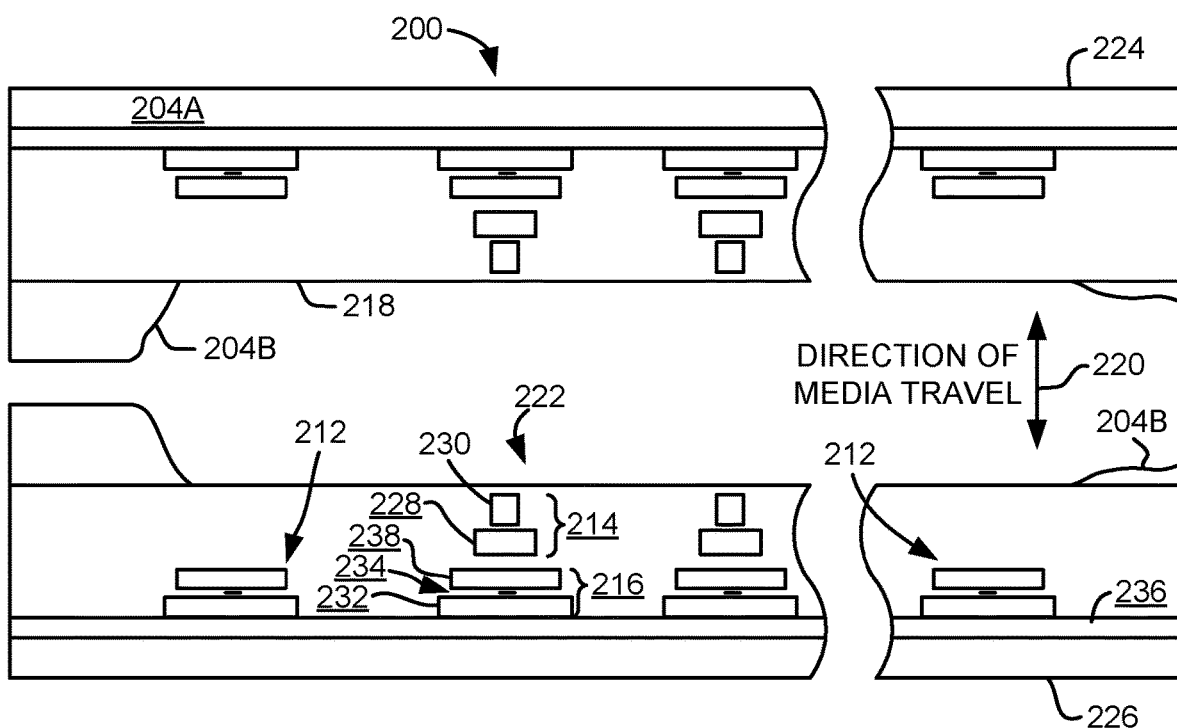
FIG. 2D is a detailed view of a partial tape bearing surface of a pair of modules.

FIG. 2D shows a partial tape bearing surface view of complementary modules of a magnetic tape head 200 according to one embodiment. In this embodiment, each module has a plurality of read/write (R/W) pairs in a piggyback configuration formed on a common substrate 204A and an optional electrically insulative layer 236. The writers, exemplified by the write transducer 214 and the readers, exemplified by the read transducer 216, are aligned parallel to an intended direction of travel of a tape medium thereacross to form an R/W pair, exemplified by the R/W pair 222. Note that the intended direction of tape travel is sometimes referred to herein as the direction of tape travel, and such terms may be used interchangeably. Such direction of tape travel may be inferred from the design of the system, e.g., by examining the guides; observing the actual direction of tape travel relative to the reference point; etc. Moreover, in a system operable for bi-direction reading and/or writing, the direction of tape travel in both directions is typically parallel and thus both directions may be considered equivalent to each other.

Several R/W pairs 222 may be present, such as 8, 16, 32 pairs, etc. The R/W pairs 222 as shown are linearly aligned in a direction generally perpendicular to a direction of tape travel thereacross. However, the pairs may also be aligned diagonally, etc. Servo readers 212 are positioned on the outside of the array of R/W pairs, the function of which is well known.

Generally, the magnetic tape medium moves in either a forward or reverse direction as indicated by arrow 220. The magnetic tape medium and head assembly 200 operate in a transducing relationship in the manner well-known in the art. The piggybacked magnetoresistive (MR) head assembly 200 includes two thin-film modules 224 and 226 of generally identical construction.

Modules 224 and 226 are joined together with a space present between closures 204B thereof (partially shown) to form a single physical unit to provide read-while-write capability by activating the writer of the leading module and reader of the trailing module aligned with the writer of the leading module parallel to the direction of tape travel relative thereto. When a module 224, 226 of a piggyback head 200 is constructed, layers are formed in the gap 218 created above an electrically conductive substrate 204A (partially shown), e.g., of AlTiC, in generally the following order for the R/W pairs 222: an insulating layer 236, a first shield 232 typically of an iron alloy such as NiFe (–), cobalt zirconium tantalum (CZT) or Al—Fe—Si (Sendust), a sensor 234 for sensing a data track on a magnetic medium, a second shield 238 typically of a nickel-iron alloy (e.g., ~80/20 at % NiFe, also known as permalloy), first and second writer pole tips 228, 230, and a coil (not shown). The sensor may be of any known type, including those based on MR, GMR, AMR, tunneling magnetoresistance (TMR), etc.

The first and second writer poles 228, 230 may be fabricated from high magnetic moment materials such as ~45/55 NiFe. Note that these materials are provided by way of example only, and other materials may be used. Additional layers such as insulation between the shields and/or pole tips and an insulation layer surrounding the sensor may be present. Illustrative materials for the insulation include alumina and other oxides, insulative polymers, etc.

The configuration of the tape head 126 according to one embodiment includes multiple modules, preferably three or more. In a write-read-write (W-R-W) head, outer modules for writing flank one or more inner modules for reading.

Figure 4:
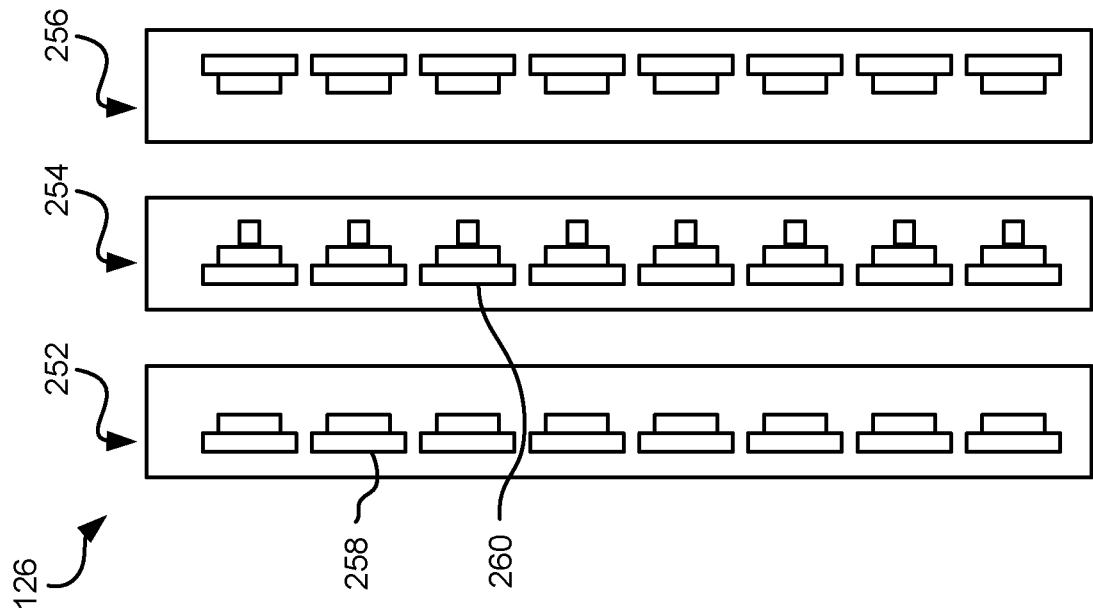
FIG. 4 is a partial tape bearing surface view of a magnetic head having a read-write-read configuration.
Figure 3:
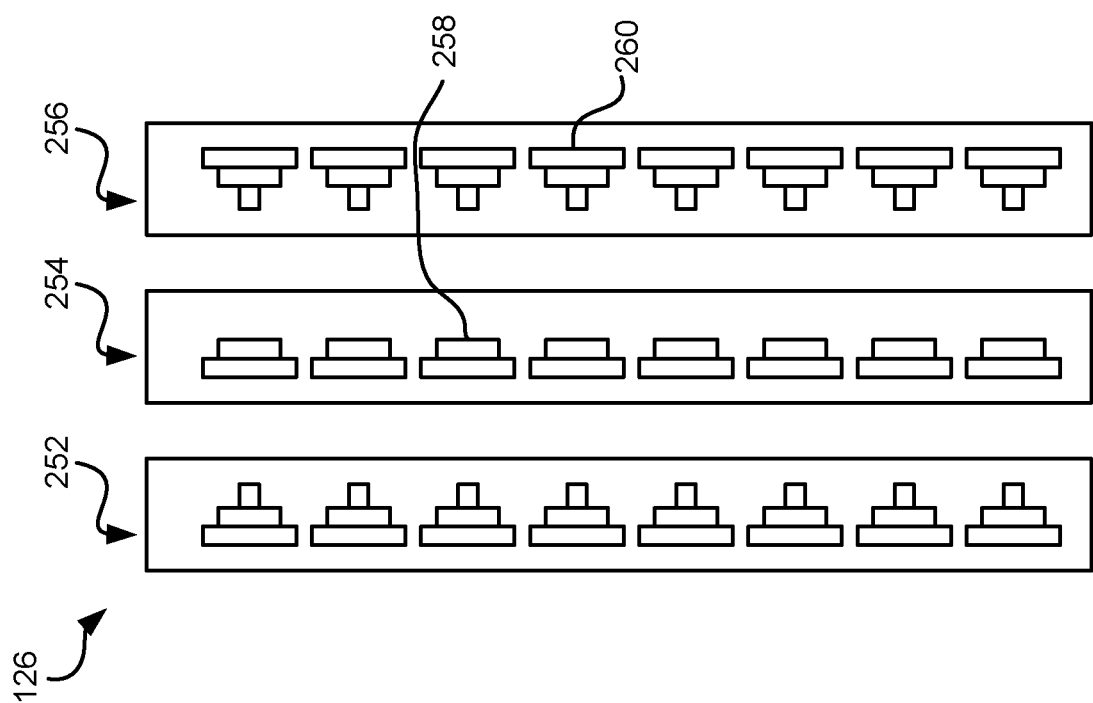
FIG. 3 is a partial tape bearing surface view of a magnetic head having a write-read-write configuration.

Referring to FIG. 3, depicting a W-R-W configuration, the outer modules 252, 256 each include one or more arrays of writers 260. The inner module 254 of FIG. 3 includes one or more arrays of readers 258 in a similar configuration. Variations of a multi-module head include a R-W-R head (FIG. 4), a R-R-W head, a W-W-R head, etc. In yet other variations, one or more of the modules may have read/write pairs of transducers. Moreover, more than three modules may be present. In further approaches, two outer modules may flank two or more inner modules, e.g., in a W-R-R-W, a R-W-W-R arrangement, etc. For simplicity, a W-R-W head is used primarily herein to exemplify embodiments of the present invention. One skilled in the art apprised with the teachings herein will appreciate how permutations of the present invention would apply to configurations other than a W-R-W configuration.

Figure 5:
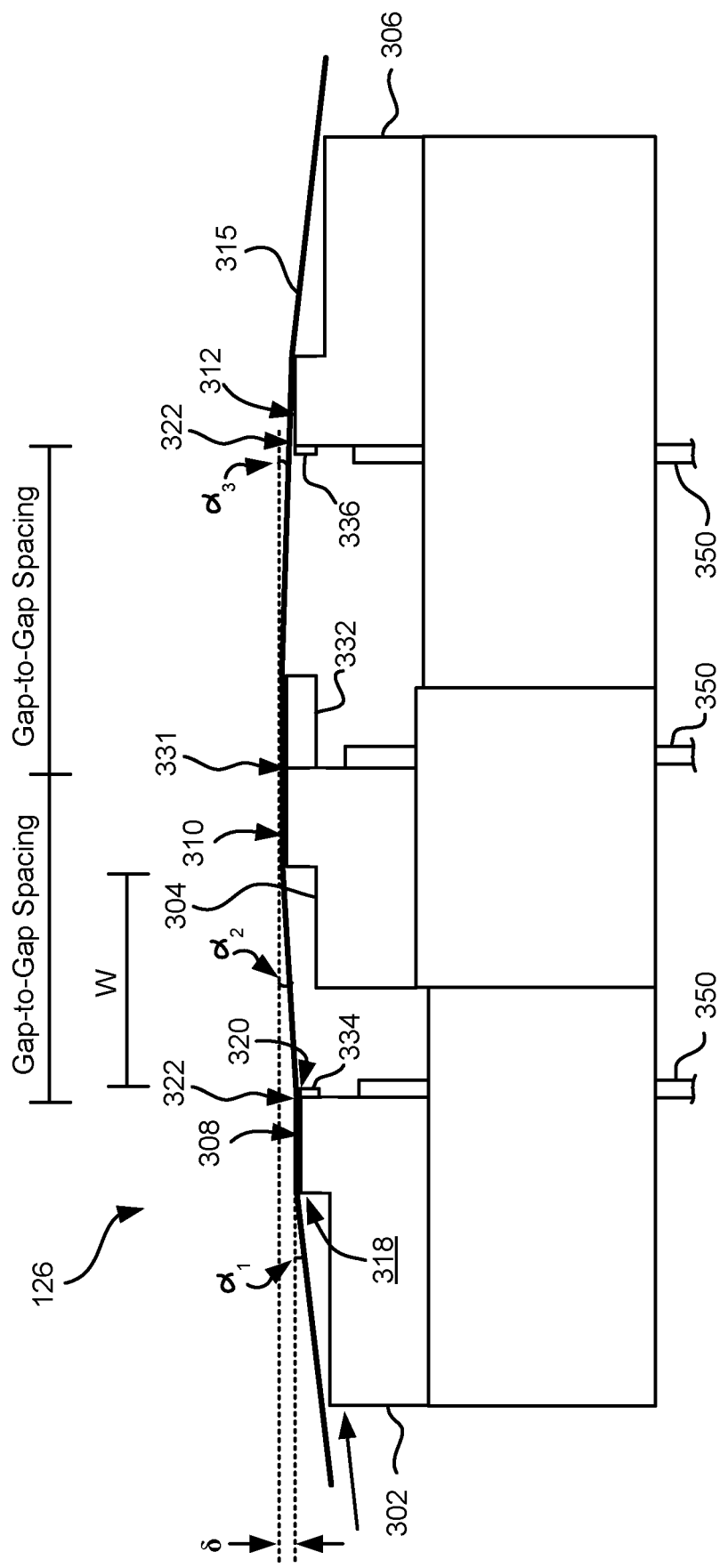
FIG. 5 is a side view of a magnetic tape head with three modules according to one embodiment where the modules all generally lie along about parallel planes.

FIG. 5 illustrates a magnetic head 126 according to one embodiment of the present invention that includes first, second and third modules 302, 304, 306 each having a tape bearing surface 308, 310, 312 respectively, which may be flat, contoured, etc. Note that while the term "tape bearing surface" appears to imply that the surface facing the tape 315 is in physical contact with the tape bearing surface, this is not necessarily the case. Rather, only a portion of the tape may be in contact with the tape bearing surface, constantly or intermittently, with other portions of the tape riding (or "flying") above the tape bearing surface on a layer of air, sometimes referred to as an "air bearing". The first module 302 will be referred to as the "leading" module as it is the first module encountered by the tape in a three module design for tape moving in the indicated direction. The third module 306 will be referred to as the "trailing" module. The trailing module follows the middle module and is the last module seen by the tape in a three module design. The leading and trailing modules 302, 306 are referred to collectively as outer modules. Also note that the outer modules 302, 306 will alternate as leading modules, depending on the direction of travel of the tape 315.

Figure 6:
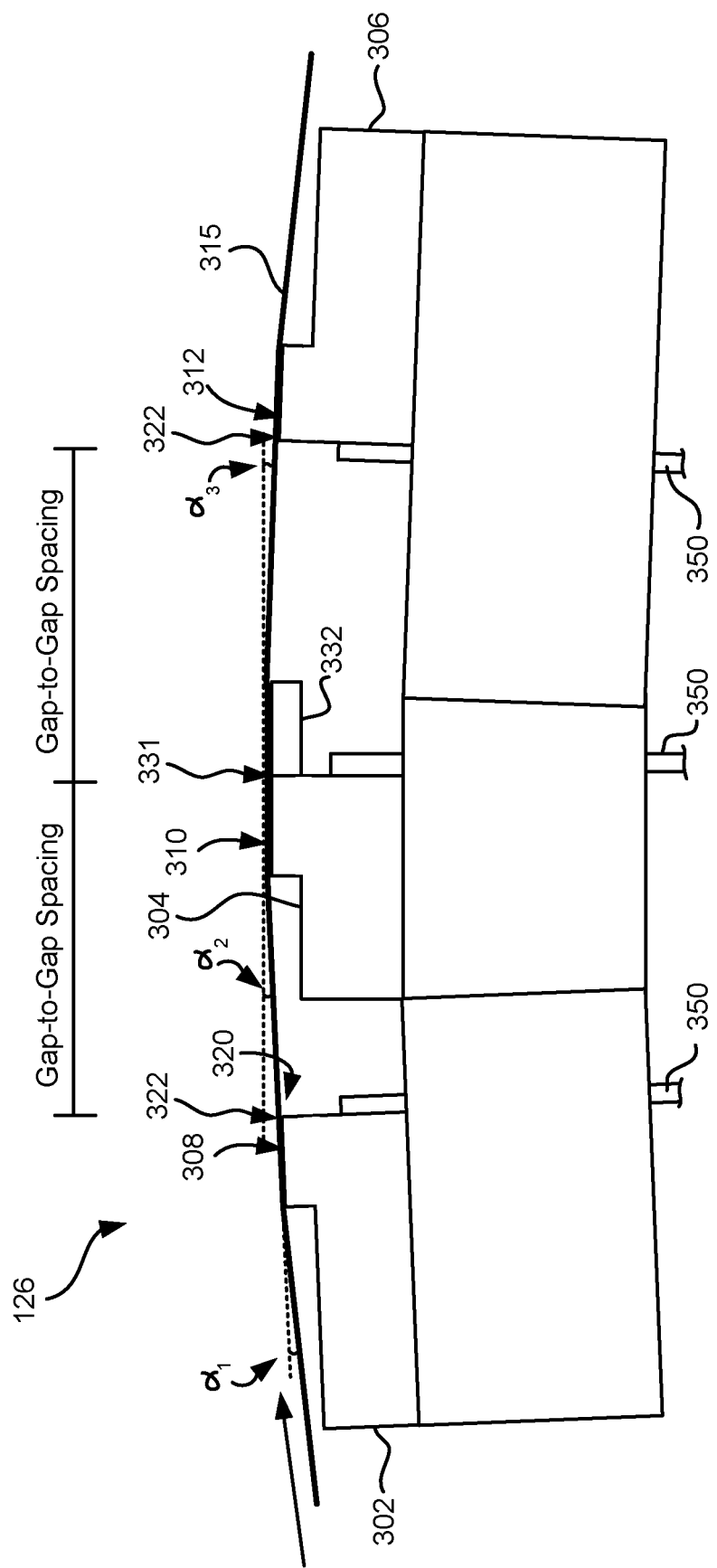
FIG. 6 is a side view of a magnetic tape head with three modules in a tangent (angled) configuration.

In one embodiment, the tape bearing surfaces 308, 310, 312 of the first, second and third modules 302, 304, 306 lie on about parallel planes (which is meant to include parallel and nearly parallel planes, e.g., between parallel and tangential as in FIG. 6), and the tape bearing surface 310 of the second module 304 is above the tape bearing surfaces 308, 312 of the first and third modules 302, 306. As described below, this has the effect of creating the desired wrap angle $\alpha_2$ of the tape relative to the tape bearing surface 310 of the second module 304.

Where the tape bearing surfaces 308, 310, 312 lie along parallel or nearly parallel yet offset planes, intuitively, the tape should peel off of the tape bearing surface 308 of the leading module 302. However, the vacuum created by the skiving edge 318 of the leading module 302 has been found by experimentation to be sufficient to keep the tape adhered to the tape bearing surface 308 of the leading module 302. The trailing edge 320 of the leading module 302 (the end from which the tape leaves the leading module 302) is the approximate reference point which defines the wrap angle $\alpha_2$ over the tape bearing surface 310 of the second module 304. The tape stays in close proximity to the tape bearing surface until close to the trailing edge 320 of the leading module 302. Accordingly, read and/or write elements 322 may be located near the trailing edges of the outer modules 302, 306. These embodiments are particularly adapted for write-read-write applications.

A benefit of this and other embodiments described herein is that, because the outer modules 302, 306 are fixed at a determined offset from the second module 304, the inner wrap angle $\alpha_2$ is fixed when the modules 302, 304, 306 are coupled together or are otherwise fixed into a head. The inner wrap angle $\alpha_2$ is approximately $\tan^{-1}(\delta/W)$ where $\delta$ is the height difference between the planes of the tape bearing surfaces 308, 310 and W is the width between the opposing ends of the tape bearing surfaces 308, 310. An illustrative inner wrap angle $\alpha_2$ is in a range of about 0.3° to about 1.1°, though can be any angle required by the design.

Beneficially, the inner wrap angle $\alpha_2$ on the side of the module 304 receiving the tape (leading edge) will be larger than the inner wrap angle $\alpha_3$ on the trailing edge, as the tape 315 rides above the trailing module 306. This difference is generally beneficial as a smaller $\alpha_3$ tends to oppose what has heretofore been a steeper exiting effective wrap angle.

Note that the tape bearing surfaces 308, 312 of the outer modules 302, 306 are positioned to achieve a negative wrap angle at the trailing edge 320 of the leading module 302. This is generally beneficial in helping to reduce friction due to contact with the trailing edge 320, provided that proper consideration is given to the location of the crowbar region that forms in the tape where it peels off the head. This negative wrap angle also reduces flutter and scrubbing damage to the elements on the leading module 302. Further, at the trailing module 306, the tape 315 flies over the tape bearing surface 312 so there is virtually no wear on the elements when tape is moving in this direction. Particularly, the tape 315 entrains air and so will not significantly ride on the tape bearing surface 312 of the third module 306 (some contact may occur). This is permissible, because the leading module 302 is writing while the trailing module 306 is idle.

Writing and reading functions are performed by different modules at any given time. In one embodiment, the second module 304 includes a plurality of data and optional servo readers 331 and no writers. The first and third modules 302, 306 include a plurality of writers 322 and no data readers, with the exception that the outer modules 302, 306 may include optional servo readers. The servo readers may be used to position the head during reading and/or writing operations. The servo reader(s) on each module are typically located towards the end of the array of readers or writers.

By having only readers or side by side writers and servo readers in the gap between the substrate and closure, the gap length can be substantially reduced. Typical heads have piggybacked readers and writers, where the writer is formed above each reader. A typical gap is 20-35 microns. However, irregularities on the tape may tend to droop into the gap and create gap erosion. Thus, the smaller the gap is the better. The smaller gap enabled herein exhibits fewer wear related problems.

In some embodiments, the second module 304 has a closure, while the first and third modules 302, 306 do not have a closure. Where there is no closure, preferably a hard coating is added to the module. One preferred coating is diamond-like carbon (DLC).

In the embodiment shown in FIG. 5, the first, second, and third modules 302, 304, 306 each have a closure 332, 334, 336, which extends the tape bearing surface of the associated module, thereby effectively positioning the read/write elements away from the edge of the tape bearing surface. The closure 332 on the second module 304 can be a ceramic closure of a type typically found on tape heads. The closures 334, 336 of the first and third modules 302, 306, however, may be shorter than the closure 332 of the second module 304 as measured parallel to a direction of tape travel over the respective module. This enables positioning the modules closer together. One way to produce shorter closures 334, 336 is to lap the standard ceramic closures of the second module 304 an additional amount. Another way is to plate or deposit thin film closures above the elements during thin film processing. For example, a thin film closure of a hard material such as Sendust or nickel-iron alloy (e.g., 45/55) can be formed on the module.

With reduced-thickness ceramic or thin film closures 334, 336 or no closures on the outer modules 302, 306, the write-to-read gap spacing can be reduced to less than about 1 mm, e.g., about 0.75 mm, or 50% less than commonly-used linear tape open (LTO) tape head spacing. The open space between the modules 302, 304, 306 can still be set to approximately 0.5 to 0.6 mm, which in some embodiments is ideal for stabilizing tape motion over the second module 304.

Depending on tape tension and stiffness, it may be desirable to angle the tape bearing surfaces of the outer modules relative to the tape bearing surface of the second module. FIG. 6 illustrates an embodiment where the modules 302, 304, 306 are in a tangent or nearly tangent (angled) configuration. Particularly, the tape bearing surfaces of the outer modules 302, 306 are about parallel to the tape at the desired wrap angle $\alpha_2$ of the second module 304. In other words, the planes of the tape bearing surfaces 308, 312 of the outer modules 302, 306 are oriented at about the desired wrap angle $\alpha_2$ of the tape 315 relative to the second module 304. The tape will also pop off of the trailing module 306 in this embodiment, thereby reducing wear on the elements in the trailing module 306. These embodiments are particularly useful for write-read-write applications. Additional aspects of these embodiments are similar to those given above.

Typically, the tape wrap angles may be set about midway between the embodiments shown in FIGS. 5 and 6.

Figure 7:
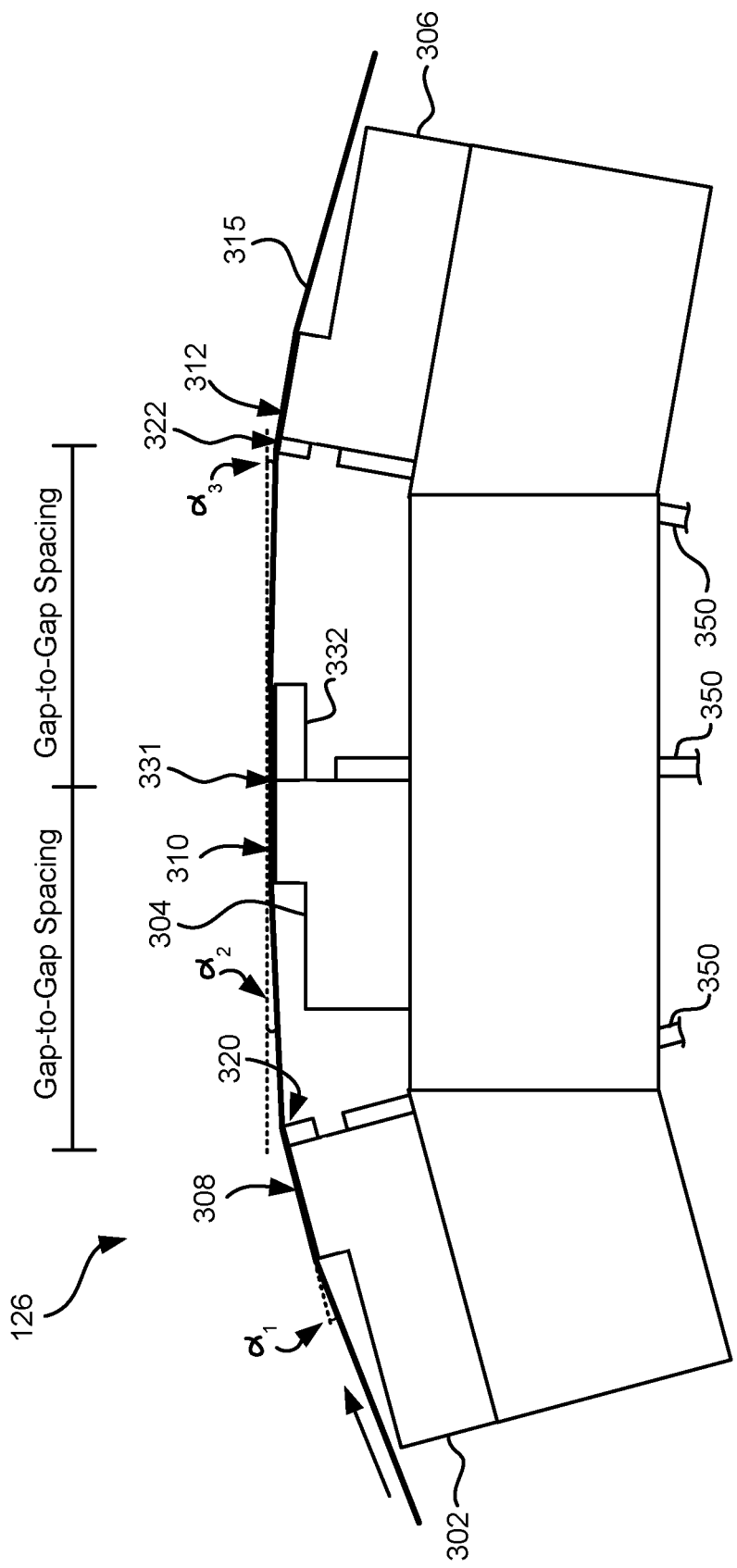
FIG. 7 is a side view of a magnetic tape head with three modules in an overwrap configuration.

FIG. 7 illustrates an embodiment where the modules 302, 304, 306 are in an overwrap configuration. Particularly, the tape bearing surfaces 308, 312 of the outer modules 302, 306 are angled slightly more than the tape 315 when set at the desired wrap angle $\alpha_2$ relative to the second module 304. In this embodiment, the tape does not pop off of the trailing module, allowing it to be used for writing or reading. Accordingly, the leading and middle modules can both perform reading and/or writing functions while the trailing module can read any just-written data. Thus, these embodiments are preferred for write-read-write, read-write-read, and write-write-read applications. In the latter embodiments, closures should be wider than the tape canopies for ensuring read capability. The wider closures may require a wider gap-to-gap separation. Therefore, a preferred embodiment has a write-read-write configuration, which may use shortened closures that thus allow closer gap-to-gap separation.

Additional aspects of the embodiments shown in FIGS. 6 and 7 are similar to those given above.

A 32 channel version of a multi-module head 126 may use cables 350 having leads on the same or smaller pitch as current 16 channel piggyback LTO modules, or alternatively the connections on the module may be organ-keyboarded for a 50% reduction in cable span. Over-under, writing pair unshielded cables may be used for the writers, which may have integrated servo readers.

The outer wrap angles $\alpha_1$ may be set in the drive, such as by guides of any type known in the art, such as adjustable rollers, slides, etc. or alternatively by outriggers, which are integral to the head. For example, rollers having an offset axis may be used to set the wrap angles. The offset axis creates an orbital arc of rotation, allowing precise alignment of the wrap angle $\alpha_1$.

To assemble any of the embodiments described above, conventional u-beam assembly can be used. Accordingly, the mass of the resultant head may be maintained or even reduced relative to heads of previous generations. In other approaches, the modules may be constructed as a unitary body. Those skilled in the art, armed with the present teachings, will appreciate that other known methods of manufacturing such heads may be adapted for use in constructing such heads. Moreover, unless otherwise specified, processes and materials of types known in the art may be adapted for use in various embodiments in conformance with the teachings herein, as would become apparent to one skilled in the art upon reading the present disclosure.

Figure 8A:
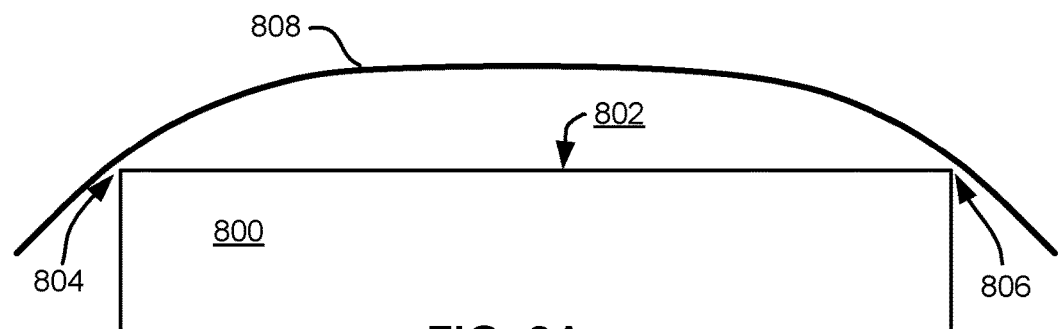
FIGS. 8A-8C are schematics depicting the principles of tape tenting.
Figure 8B:
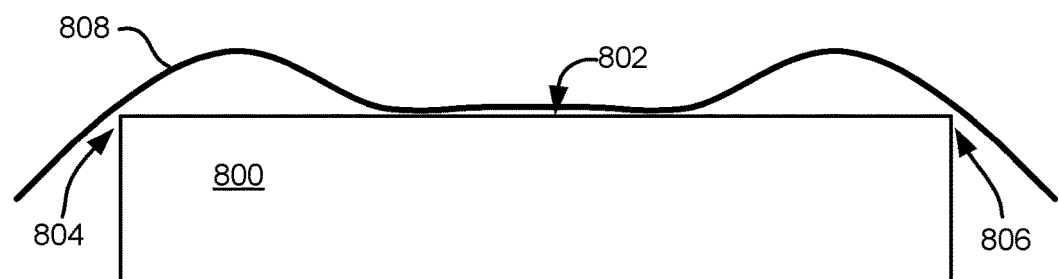
Figure 8C:
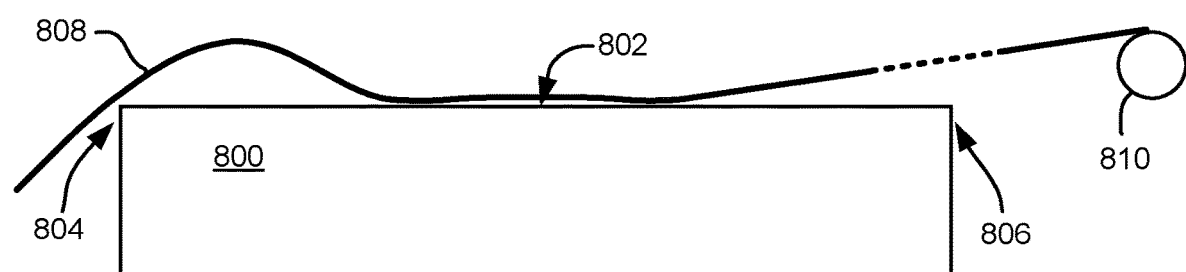

As a tape is run over a module, it is preferred that the tape passes sufficiently close to magnetic transducers on the module such that reading and/or writing is efficiently performed, e.g., with a low error rate. According to some approaches, tape tenting may be used to ensure the tape passes sufficiently close to the portion of the module having the magnetic transducers. To better understand this process, FIGS. 8A-8C illustrate the principles of tape tenting. FIG. 8A shows a module 800 having an upper tape bearing surface 802 extending between opposite edges 804, 806. A stationary tape 808 is shown wrapping around the edges 804, 806. As shown, the bending stiffness of the tape 808 lifts the tape off of the tape bearing surface 802. Tape tension tends to flatten the tape profile, as shown in FIG. 8A. Where tape tension is minimal, the curvature of the tape is more parabolic than shown.

FIG. 8B depicts the tape 808 in motion. The leading edge, i.e., the first edge the tape encounters when moving, may serve to skive air from the tape, thereby creating a subambient air pressure between the tape 808 and the tape bearing surface 802. In FIG. 8B, the leading edge is the left edge and the right edge is the trailing edge when the tape is moving left to right. As a result, atmospheric pressure above the tape urges the tape toward the tape bearing surface 802, thereby creating tape tenting proximate each of the edges. The tape bending stiffness resists the effect of the atmospheric pressure, thereby causing the tape tenting proximate both the leading and trailing edges. Modeling predicts that the two tents are very similar in shape.

FIG. 8C depicts how the subambient pressure urges the tape 808 toward the tape bearing surface 802 even when a trailing guide 810 is positioned above the plane of the tape bearing surface.

It follows that tape tenting may be used to direct the path of a tape as it passes over a module. As previously mentioned, tape tenting may be used to ensure the tape passes sufficiently close to the portion of the module having the magnetic transducers, preferably such that reading and/or writing is efficiently performed, e.g., with a low error rate.

Magnetic tapes may be stored in tape cartridges that are, in turn, stored at storage slots or the like inside a data storage library. The tape cartridges may be stored in the library such that they are accessible for physical retrieval. In addition to magnetic tapes and tape cartridges, data storage libraries may include data storage drives that store data to, and/or retrieve data from, the magnetic tapes. Moreover, tape libraries and the components included therein may implement a file system which enables access to tape and data stored on the tape.

File systems may be used to control how data is stored in, and retrieved from, memory. Thus, a file system may include the processes and data structures that an operating system uses to keep track of files in memory, e.g., the way the files are organized in memory. Linear Tape File System (LTFS)

is an exemplary format of a file system that may be implemented in a given library in order to enables access to compliant tapes. It should be appreciated that various embodiments herein can be implemented with a wide range of file system formats, including for example IBM Spectrum Archive Library Edition (LTFS LE). However, to provide a context, and solely to assist the reader, some of the embodiments below may be described with reference to LTFS which is a type of file system format. This has been done by way of example only, and should not be deemed limiting on the invention defined in the claims.

A tape cartridge may be "loaded" by inserting the cartridge into the tape drive, and the tape cartridge may be "unloaded" by removing the tape cartridge from the tape drive. Once loaded in a tape drive, the tape in the cartridge may be "threaded" through the drive by physically pulling the tape (the magnetic recording portion) from the tape cartridge, and passing it above a magnetic head of a tape drive. Furthermore, the tape may be attached on a take-up reel (e.g., see 121 of FIG. 1A above) to move the tape over the magnetic head.

Once threaded in the tape drive, the tape in the cartridge may be "mounted" by reading metadata on a tape and bringing the tape into a state where the LTFS is able to use the tape as a constituent component of a file system. Moreover, in order to "unmount" a tape, metadata is preferably first written on the tape (e.g., as an index), after which the tape may be removed from the state where the LTFS is allowed to use the tape as a constituent component of a file system. Finally, to "unthread" the tape, the tape is unattached from the take-up reel and is physically placed back into the inside of a tape cartridge again. The cartridge may remain loaded in the tape drive even after the tape has been unthreaded, e.g., waiting for another read and/or write request. However, in other instances, the tape cartridge may be unloaded from the tape drive upon the tape being unthreaded, e.g., as described above.

Magnetic tape is a sequential access medium. Thus, new data is written to the tape by appending the data at the end of previously written data. It follows that when data is recorded in a tape having only one partition, metadata (e.g., allocation information) is continuously appended to an end of the previously written data as it frequently updates and is accordingly rewritten to tape. As a result, the rearmost information is read when a tape is first mounted in order to access the most recent copy of the metadata corresponding to the tape. However, this introduces a considerable amount of delay in the process of mounting a given tape.

To overcome this delay caused by single partition tape mediums, the LTFS format includes a tape that is divided into two partitions, which include an index partition and a data partition. The index partition may be configured to record metadata (meta information), e.g., such as file allocation information (Index), while the data partition may be configured to record the body of the data, e.g., the data itself.

Figure 9:
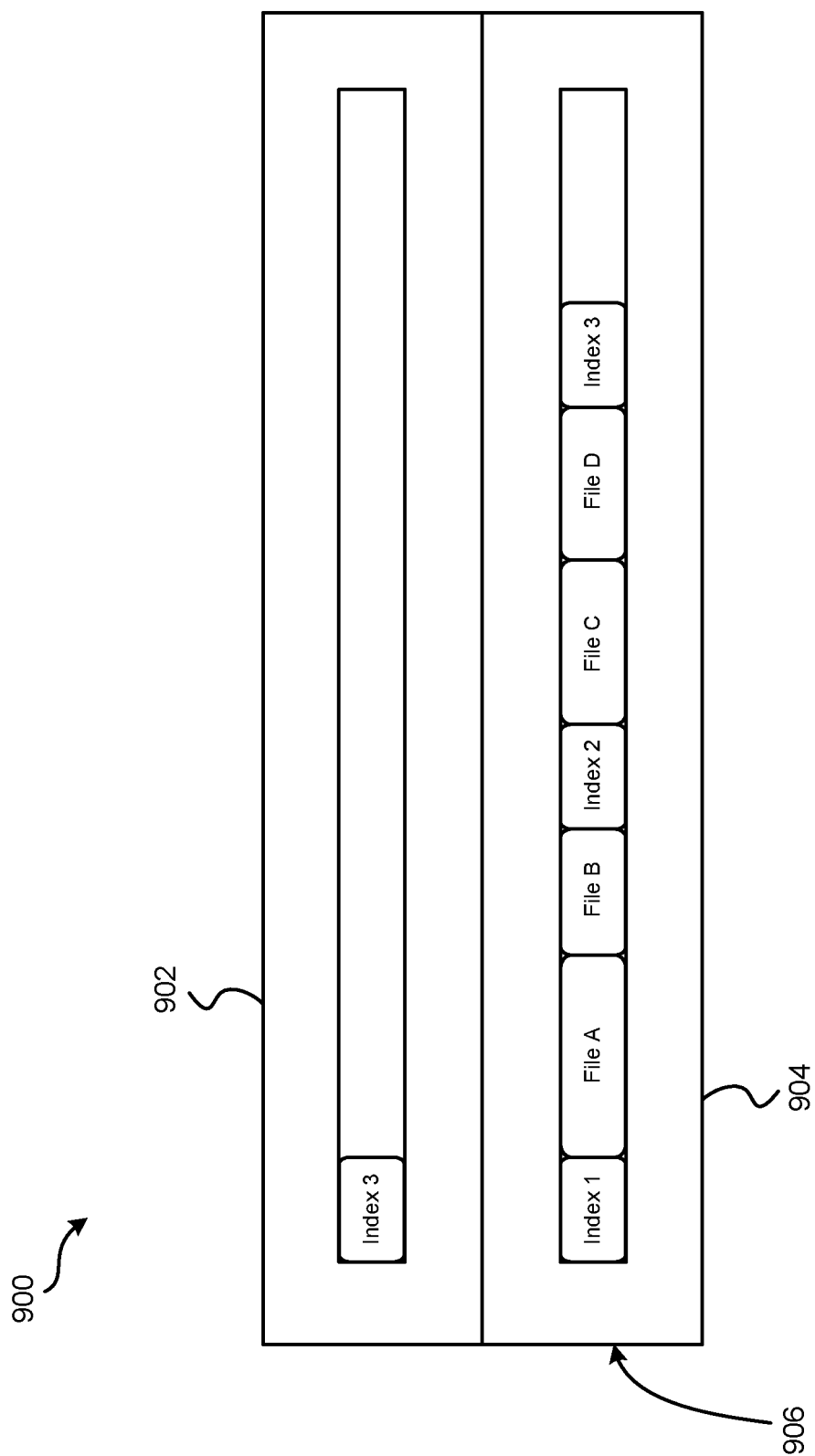
FIG. 9 is a representational diagram of files and indexes stored on a magnetic tape according to one embodiment.

Looking to FIG. 9, a magnetic tape 900 having an index partition 902 and a data partition 904 is illustrated according to one embodiment. As shown, data files and indexes are stored on the tape. The LTFS format allows for index information to be recorded in the index partition 902 at the beginning of tape 906, as would be appreciated by one skilled in the art upon reading the present description.

As index information is updated, it preferably overwrites the previous version of the index information, thereby allowing the currently updated index information to be accessible at the beginning of tape in the index partition. According to the specific example illustrated in FIG. 9, a most recent version of metadata Index 3 is recorded in the index partition 902 at the beginning of the tape 906. Conversely, all three version of metadata Index 1, Index 2, Index 3 as well as data File A, File B, File C, File D are recorded in the data partition 904 of the tape. Although Index 1 and Index 2 are old (e.g., outdated) indexes, because information is written to tape by appending it to the end of the previously written data as described above, these old indexes Index 1, Index 2 remain stored on the tape 900 in the data partition 904 without being overwritten.

The metadata may be updated in the index partition 902 and/or the data partition 904 the same or differently depending on the desired embodiment. According to some embodiments, the metadata of the index and/or data partitions 902, 904 may be updated in response to the tape being unmounted, e.g., such that the index may be read quickly from the index partition when that tape is mounted again. The metadata is preferably also written in the data partition 904 so the tape may be mounted using the metadata recorded in the data partition 904, e.g., as a backup option.

According to one example, which is no way intended to limit the invention, LTFS LE may be used to provide the functionality of writing an index in the data partition when a user explicitly instructs the system to do so, or at a time designated by a predetermined period which may be set by the user, e.g., such that data loss in the event of sudden power stoppage can be mitigated.

In modern tape head modules, the nominal center to center spacing between servo readers is 2859 µm (e.g. according to LTO specification). However, the spacing may be inconsistent between tape head modules. The nominal servo reader spacing may vary from module to module by up to 500 nm, and possibly even more. At present, the variation of servo reader spacing has been determined from indirect measurements using the magnetic recording media. This method gives only the relative misregistration between a particular head and tape. Heads may be compared by using a single tape but this does not give an absolute measure of spacing between servo readers.

The cause of the variation is not well understood. The variation is accompanied by expansion or contraction of the transducer array (including the servo readers) in the modules. This means that at fine enough pitch, tracks written by one head may be significantly misregistered relative to the read transducers of a read head (or even the same head) and may not be readable. Furthermore, misregistration may be compounded by creeping of the tape that occurs over time with the long-term storage of tape wound on a cartridge. It would be desirable to be able to account for misregistration between features of a module.

According to various embodiments described herein, an apparatus allows measurement of location coordinates of features on a scale of a few microns (µm) separated by distances on the scale of a few millimeters (mm) to a precision of a few nanometers (nm). In some approaches, a precise distance may be determined between the servo reading sensors of a timing-based servo tape head module or between transducers in the array. A distance may be measured over the transducer span according to the 2859 µm specification to within 10 nm of precision. At present, a variation of as little as approximately ±50 nm may be a problematic level of variation.

As alluded to above, conventional methods of measuring distances between features of a tape head module do not measure the servo-servo distance to within a few nanometers. For example, TMR sensors have feature size in the micron or sub-micron range, and images thereof tend to have insufficient resolution using optical microscopy. Commercial measurement systems such as atomic force microscopy (AFM), magnetic force microscope (MFM), scanning electron microscopy (SEM), etc., may be capable to position components to a precision of few microns over a span of interest.

According to various embodiments, images of features of interest may be captured with nanometer precision by stepping each feature into view using a nanometer precision motion device, as described herein. The images may be subsequently analyzed to determine the extent of misregistration due to misregistration between the features (e.g. feature 1 versus feature 2). Furthermore, the described precision motion device may not be subject to backlash and other non-repeatable mechanical deficiencies that occur with conventional devices. As described in more detail below, various embodiments include imaging each feature once without positioning the feature precisely, thereby resulting in obtaining measurements between features relatively quickly.

Figure 10:
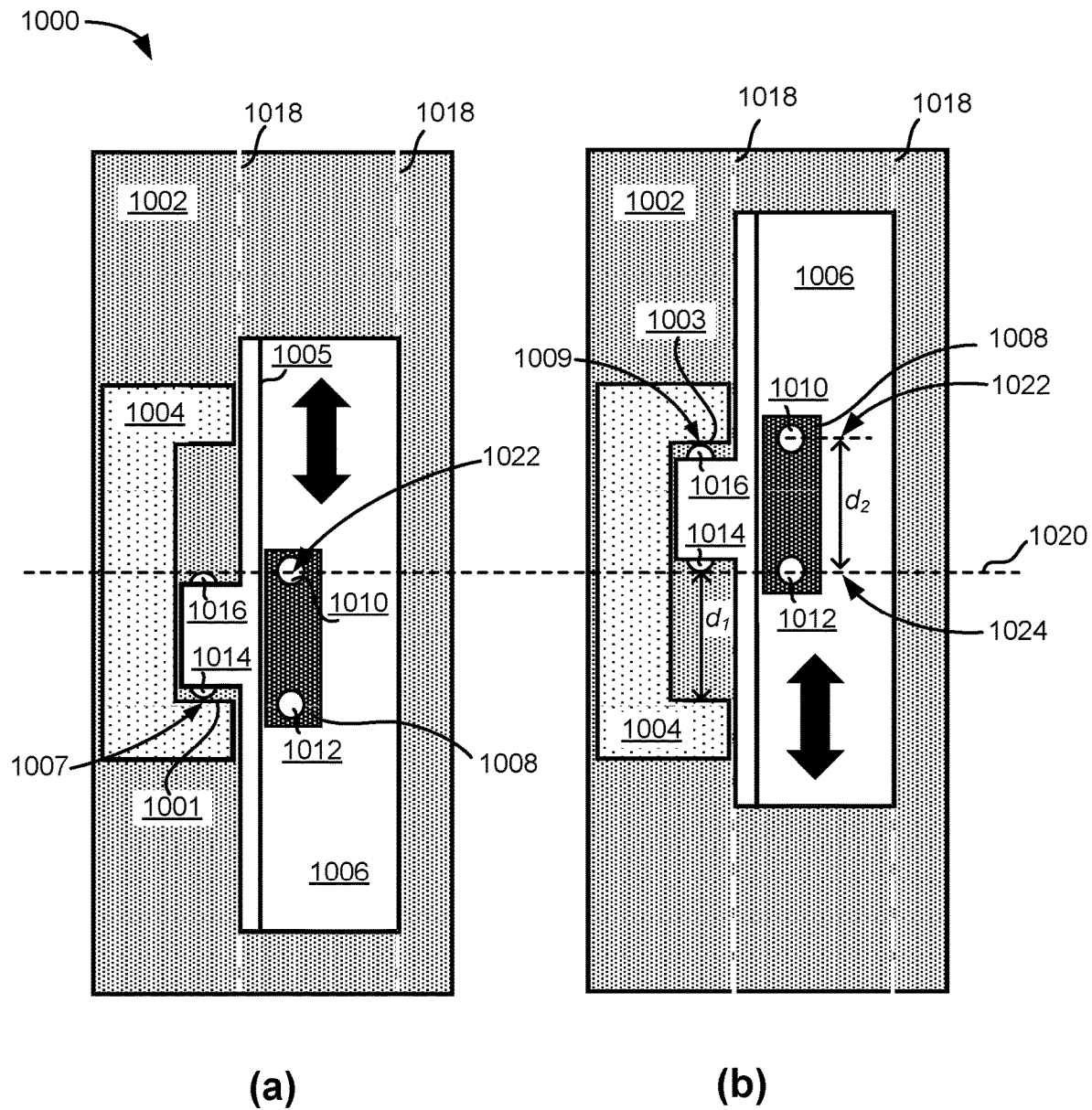
FIG. 10 is a schematic drawing of a top view of an apparatus, according to one embodiment.

FIG. 10 depicts an apparatus 1000 for moving a sample a precise distance in an imaging device, in accordance with one embodiment. As an option, the present apparatus 1000 may be implemented in conjunction with features from any other embodiment listed herein, such as those described with reference to the other FIGS. Of course, however, such an apparatus 1000 and others presented herein may be used in various applications and/or in permutations which may or may not be specifically described in the illustrative embodiments listed herein. Further, the apparatus 1000 presented herein may be used in any desired environment.

According to one embodiment, an apparatus 1000 includes a base 1002 and a movable portion 1006 positioned above the base 1002 and configured to move relative to the base linearly (in a longitudinal direction arrow) along the base 1002. The extent of motion of the movable portion 1006 being constrained by stops. In some approaches, a precise distance $d_1$, or step, between two positions may define the extent of motion of the movable portion 1006, as exemplified by FIG. 10, parts (a) and (b). In some approaches, the movable portion 1006 may be a linear motion device (e.g. a slide).

In some approaches, a guide 1004 (e.g. a yoke, a u-shaped bracket, etc.) may set the positions of each flat stop 1001, 1003. In some approaches, the guide 1004 may be fixedly attached to the base 1002. The flat stops 1001, 1003 may define the extent of motion of the movable portion 1006 relative to the stops 1014, 1016 of the movable portion 1006. In other approaches, the movable portion 1006 may set the position of the stops 1014, 1016 of the movable portion 1006 to define the extent of motion of the movable portion 1006 between the flat stops 1001, 1003 of the guide 1004.

The sample 1008 having features 1010, 1012 to be imaged is placed on the movable portion 1006, and images of the features 1010, 1012 of the sample 1008 can be captured when the movable portion is in the first and second positions. Because the precise amount of movement of the object is known, accurate measurements between features appearing in the image at the first and second positions can be made.

In some approaches, the extent of motion may be defined by limits of movement of a movable portion to a predefined distance $d_1$. The predefined distance $d_1$ may be an expected distance between two features to be measured. According to one approach, the extent of motion may be within 10 nm of a predefined distance $d_1$ of greater than 1 mm, and preferably to within one nanometer.

The range of motion of the movable portion 1006 may be constrained by stops 1014, 1016 of any kind, thereby defining the extent of motion of the movable portion 1006 relative to the base 1002. In some approaches, as shown in FIG. 10, stops 1014, 1016 may be on the movable portion 1006. In other approaches, stops may be on the base 1002. In further approaches, the stops may be on a guide coupled to the base 1002. Any type of stop which would become apparent to one skilled in the art upon reading the present description may be used to precisely set the extent of motion of the movable portion 1006.

Linear motion of the movable portion 1006 may be ensured by any mechanism that would become apparent to one skilled in the art upon reading the present description. For example, the movable portion may slide along a channel in the base. In other approaches, the movable portion may slide between guides coupled to the base. In further approaches, the movable portion may slide along a rail that extends through the movable portion.

In the embodiment shown in FIG. 10, the movable portion 1006 is configured to move along a track 1018 in a direction (arrow) parallel to a guide 1004. The guide 1004 has flat stops 1001, 1003 for engaging the stops 1014, 1016 on the movable portion 1006.

Continuing with the exemplary embodiment shown in FIG. 10, a predefined distance $d_1$ may be set as the distance between the initial position (FIG. 10, part (a)) of the first stop 1014 of the movable portion 1006 when the first stop 1014 forms a point of engagement 1007 with the first flat stop 1001 of the guide 1004 and the final position (FIG. 10, part (b)) of the first stop 1014 of the movable portion when the second stop 1016 forms a point of engagement 1009 with the second flat stop 1003 of the guide 1004.

The predefined distance $d_1$ may be set permanently, may be adjustable, may be resettable, etc. The predefined distance $d_1$ may be set, detected, calibrated and/or adjusted using precise measurement techniques known by one skilled in the art, for example, an interferometer, gauge blocks, etc.

In one approach, the predefined distance $d_1$ may be set by using predefined stop positions that provide the desired distance. In some approaches, the predefined distance may be set by machining at least one of the flat stops 1001, 1003 that create the point of engagement 1007, 1009 with the stops 1014, 1016 on the movable portion, respectively. In other approaches, at least one of the stops is machined to alter its profile. In further approaches, one or more of the stops may be replaceable to adjust the extent of motion.

In some approaches, at least one of the stops 1014, 1016 and/or flat stops 1001, 1003 may be adjustable for changing the extent of motion of the movable portion. For example, and not meant to be limiting in any way, if a specific measurement of distance is desired between two features of a sample, one of the stops may be adjusted to set a predefined distance, e.g., by a worm screw that extends through the guide 1004. In one approach, an interferometer may be used to help precisely position one of the stops relative to the other, e.g., to within approximately a nanometer of the target distance.

Once the stops 1014, 1016, 1001, 1003 are in their final state, calibrations using the aforementioned precise measurement techniques may be used to determine the precise distance $d_1$ and any offset from the design distance can be considered and/or compensated for during use, using known techniques.

Looking back to FIG. 10, the movable portion 1006 may have a feature (e.g., slot 1005) configured to position the sample 1008 in a precise location on the movable portion

1006. As would be understood by one skilled in the art, and for the purposes of these embodiments, precision is defined as being within 10 nm.

Various factors may affect the actual extent of motion of the movable portion from an initial position (part (a) of FIG. 10) to a final position (part (b) of FIG. 10) compared to a predefined distance $d_1$. Factors that may affect the extent of motion are temperature of the apparatus, temperature of the movable portion, force of engagement of at least one of the stops with the opposing component, wear over time, etc. Accordingly, preferred embodiments include features directed at minimizing the effects of the aforementioned factors.

According to one embodiment, stops may be comprised of a material with a hardness on the Mohr scale of at least 9. The Mohr scale is a scale between 1 and 10 of hardness of materials with 1 having the least hardness and 10 having the greatest hardness. In some approaches, the stops include corundum (e.g., sapphire), diamond, a combination thereof, etc. In some approaches, the stops may include Invar (e.g. a nickel-iron alloy with a coefficient of thermal expansion of about 1.2 ppm/° C.). In yet other approaches, the stops may include hardened steel.

Changes in temperature may affect the expansion and contraction of the material to be measured. Thus, according to various embodiments, components of the apparatus may include a material with a coefficient of thermal expansion near zero at room temperature. In some approaches, the stops, movable portion and/or guide may include a material with a thermal expansion coefficient near zero at room temperature, e.g., Invar. For purposes of these embodiments, room temperature is defined as between 20° to 25° C. A coefficient of thermal expansion near zero is defined to be at most 1 to 2 ppm/° C.

Also, the selected temperature of operation should be maintained to within one-quarter of one degree C., preferably better.

In some embodiments, the apparatus may include a temperature sensor for detecting a temperature in an immediate vicinity of the apparatus, e.g., the ambient temperature, the temperature of the sample, the temperature of apparatus, etc. In some approaches, the movable portion includes a temperature sensor for detecting a temperature of the movable portion. The temperature reading may provide an indication of any extent of thermal expansion or contraction of the apparatus and/or sample, and appropriate actions can be taken, such as taking remedial measures, or performing the desired imaging. In preferred embodiments, the apparatus functions in a temperature-controlled environment, thereby allowing use of the apparatus under optimal conditions.

In some approaches, the predefined distance $d_1$ may be determined from an expected distance between features of a sample. Particularly, the predefined distance $d_1$ may correspond to an ideal, or design, distance between the first feature 1010 and the second feature 1012 of the sample 1008. For example, and not meant to be limiting in any way, the servo reader spacing (e.g. center to center distance between two servo readers) on a tape head module is 2859 μm (according to LTO specifications). Thus, as shown in FIG. 10, the extent of motion may be set to a predefined distance $d_1$ of 2859 μm such that the movement of the movable portion 1006 is constrained by the stops 1014, 1016 between points of engagement 1007, 1009 at the flat stops 1001, 1003 of a guide 1004. In some approaches, at least one of the stops 1014, 1016 may be adjusted so that the predefined distance $d_1$ measures precisely 2859 μm.

As shown, part (a) of FIG. 10 depicts an initial position of the movable portion 1006 with the sample 1008 having features 1010, 1012. In the initial position, the first feature 1010 may be in a first position 1022 aligned with an imaginary reference line 1020. The reference line may be the location of the imaging device (not shown). The first position 1022 of the first feature 1010 may set the location of the reference line 1020 according to the stop 1014 of the movable portion 1006 having a point of engagement 1007 with the flat stop 1001 of a guide 1004. An image of the first feature 1010 of the sample 1008 at the first position 1022 may be generated.

Part (b) of FIG. 10 depicts the result of movement of the movable portion 1006 according to a predefined distance $d_1$ in which the stop 1016 of the movable portion 1006 reaches a point of engagement 1009 with the flat stop 1003 of the guide 1004. The reference line 1020 may provide a reference of the first position 1022 of the first feature 1010 for the second position 1024 of the second feature 1012. An image of the second feature 1012 of the sample 1008 at the second position 1024 may be generated after movement of the movable portion the predefined distance $d_1$.

From these images, the actual distance $d_2$ between the first and second features 1010, 1012 may be determined. For example, a misregistration between the image generated of the first feature 1010 at the first position 1022 and of the second feature 1012 at the second position 1024 may be determined. In some approaches, the distance $d_2$ may be the predefined distance $d_1$ adjusted for misregistration of the actual position of the second feature 1012 (according to the first feature 1010, according to a reference line 1020, etc.).

Figure 13:
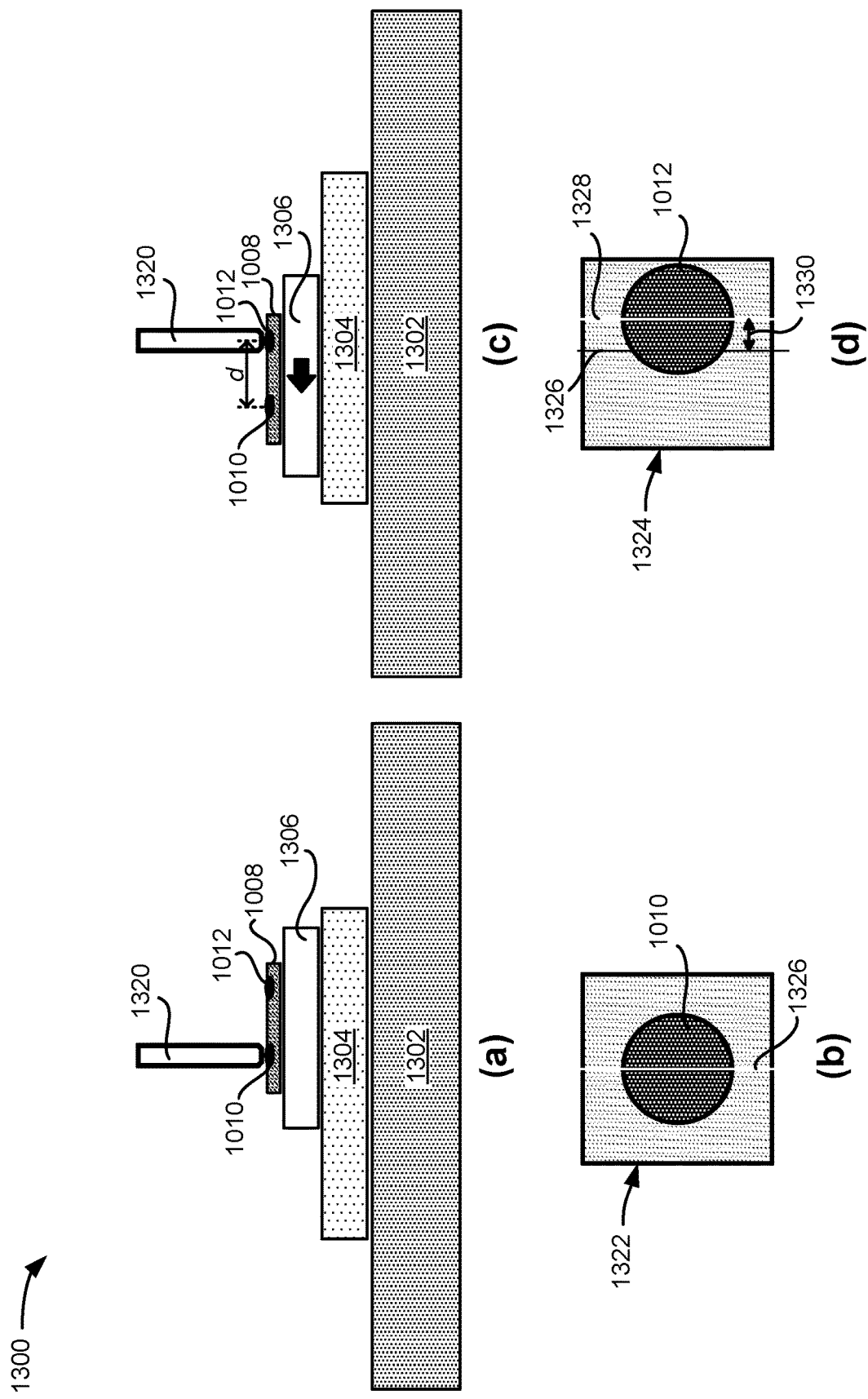
FIG. 13 is a schematic drawing of a side view of an apparatus, according to one embodiment.

In some approaches, a comparison of the actual second position 1024 of the second feature 1012 to the expected position of the second feature (according to a reference line 1020, according to the first position 1022 of the first feature 1010, etc.) may generate a correction of the distance between the first feature 1010 and the second feature 1012 and provide a precise measurement of the distance $d_2$ between the first feature 1010 and the second feature 1012 of the sample 1008 (e.g. the actual servo reader spacing of a tape head module). FIG. 13 describes an approach of a detailed method of determining the actual distance between features with nanometer precision.

In various embodiments described herein, the precise distance in millimeters between micron-sized features may be determined within nanometers of precision. In some approaches, the precise distance may be measured between two micron-sized features within nanometers. In other approaches, the precise distance between three or more micron-sized features may be measured within nanometers. In some approaches, the features may be components of a transducer array (e.g. servos, reader transducers, writer transducers, etc). In other approaches, the features may be components of the tape head module. These approaches are presented by example and are not meant to be limiting in any way to one who is skilled in the art upon reading this description.

Figure 11:
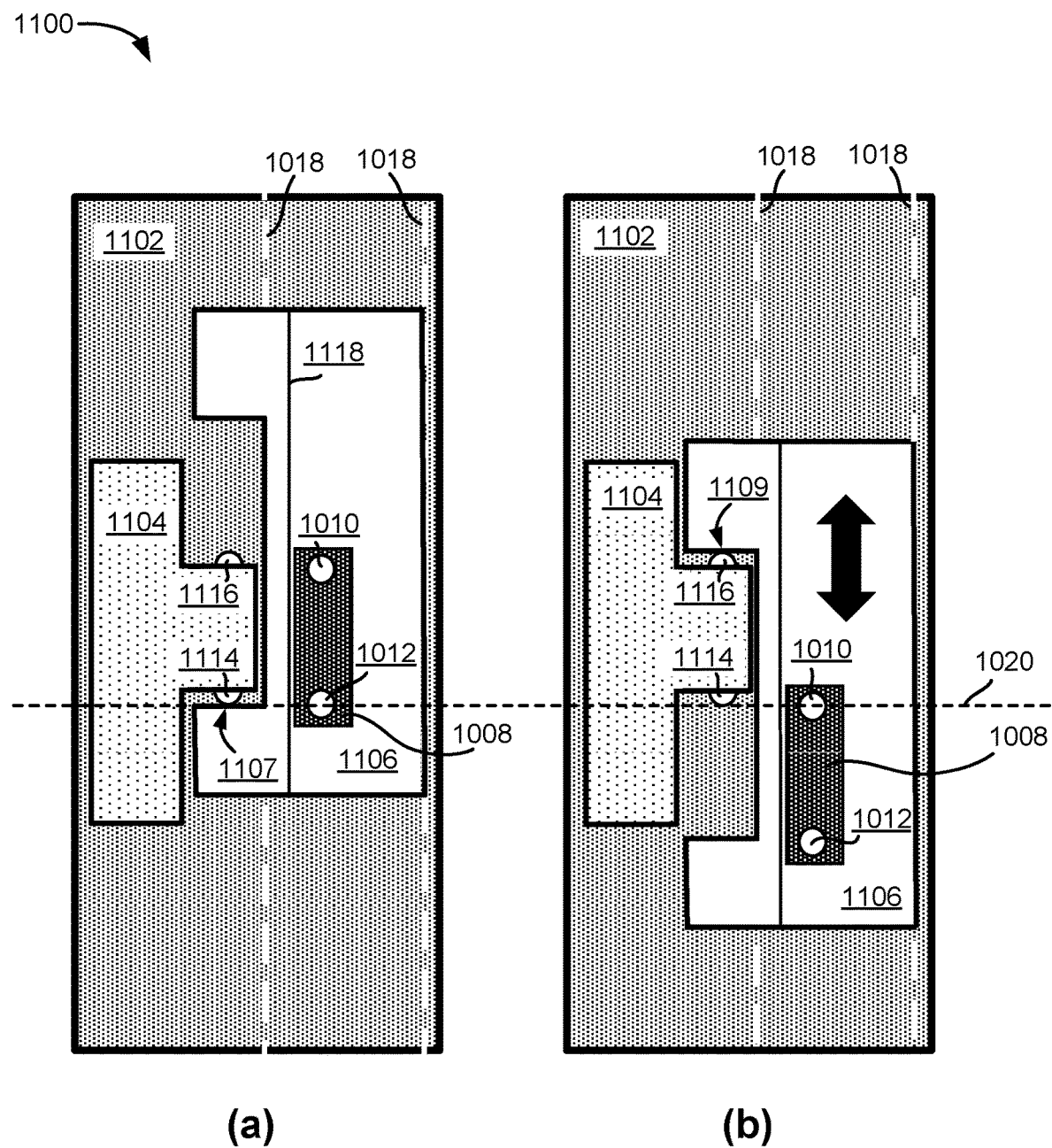
FIG. 11 is a schematic drawing of a top view of an apparatus, according to one embodiment.

As shown in FIG. 11, one embodiment of an apparatus 1100 may have stops 1114, 1116 positioned on a guide 1104. In some approaches, the guide 1104 (e.g. yoke, u-shaped bracket, etc.) may be fixedly attached to the base 1102. The movable portion 1106 may be positioned above a base 1102 and may be configured to move linearly (in a longitudinal direction arrow) along the base 1102.

The extent of motion of the movable portion 1106 being constrained by stops. In some approaches, a precise distance between two positions may define the extent of motion of the movable portion 1106. In some approaches, the movable portion 1106 may have a point of engagement 1107, 1109 for engaging the stops 1114, 1116 on the guide 1104. The movable portion 1106 may have a feature (e.g., slot 1118) configured to position the sample 1008 in a precise location.

In yet other approaches, stops may be on a base, etc.

As should be apparent to one skilled in the art, a plethora of embodiments are encompassed within the present disclosure.

Various configurations of the apparatus described herein are preferably usable as, and/or with, with one or more imaging systems. For example, the base of the apparatus may be configured to fit on a stage of an atomic force microscope (AFM). In other approaches, the base may be configured to fit on a stage of a magnetic force microscope (MFM). In some approaches, the base may be configured to fit on a stage of a scanning electron microscope (SEM). In other approaches, the base may be configured to fit on a stage of an ultraviolet microscope. In yet other approaches, the base may be configured to fit on a stage of an optical microscope.

In some approaches, the apparatus includes an AFM. In other approaches, the apparatus includes a MFM. In yet other approaches, the apparatus includes a SEM. In other approaches, the apparatus includes an ultraviolet microscope. In yet other approaches, the apparatus includes an optical microscope. These approaches are not meant to be limiting in any way, and any imaging device may be used as understood by one skilled in the art.

In some embodiments, a precision linear motor-driven stage of the imaging device may be used in conjunction with the movable portion of the apparatus as described herein to acquire the desired positioning. The stage of the imaging device may move the sample the expected displacement distance between two features of a sample (three features of a sample, multiple features of a sample, etc.).

In some approaches, the apparatus includes a stage specific to a particular imaging device. The stage may be operated by the controller of the imaging device such that the controller is programmed to move the stage with a linear, 2D, and/or rotational degree of freedom. The stage may be mounted with the movable portion measurement apparatus as described herein. Moving the stage with a rotational degree of freedom may allow an image to be generated along an axis of the distance between features with a precision of aligning the features within 0.001 degrees or better with the direction of motion (e.g. de-skewing the position of the sample).

In yet a further approach, the apparatus may include a plurality of movable portions and related components to allow precise measurements of sample features along two or more different axes. An example is a Cartesian X-Y coordinate system. The movable portions may be positioned relative to one another in any suitable manner to enable imaging of features that are separated by more than the size of the imaging field. In one embodiment, the movable portions may be stacked, where the sample is positioned on the upper movable portion, which in turn moves with the lower movable portion along a different axis of movement. (See the embodiment of FIGS. 15A-15C for another approach where the features in the X-Y system are within the imaging field along a single axis of movement.)

Figure 12:
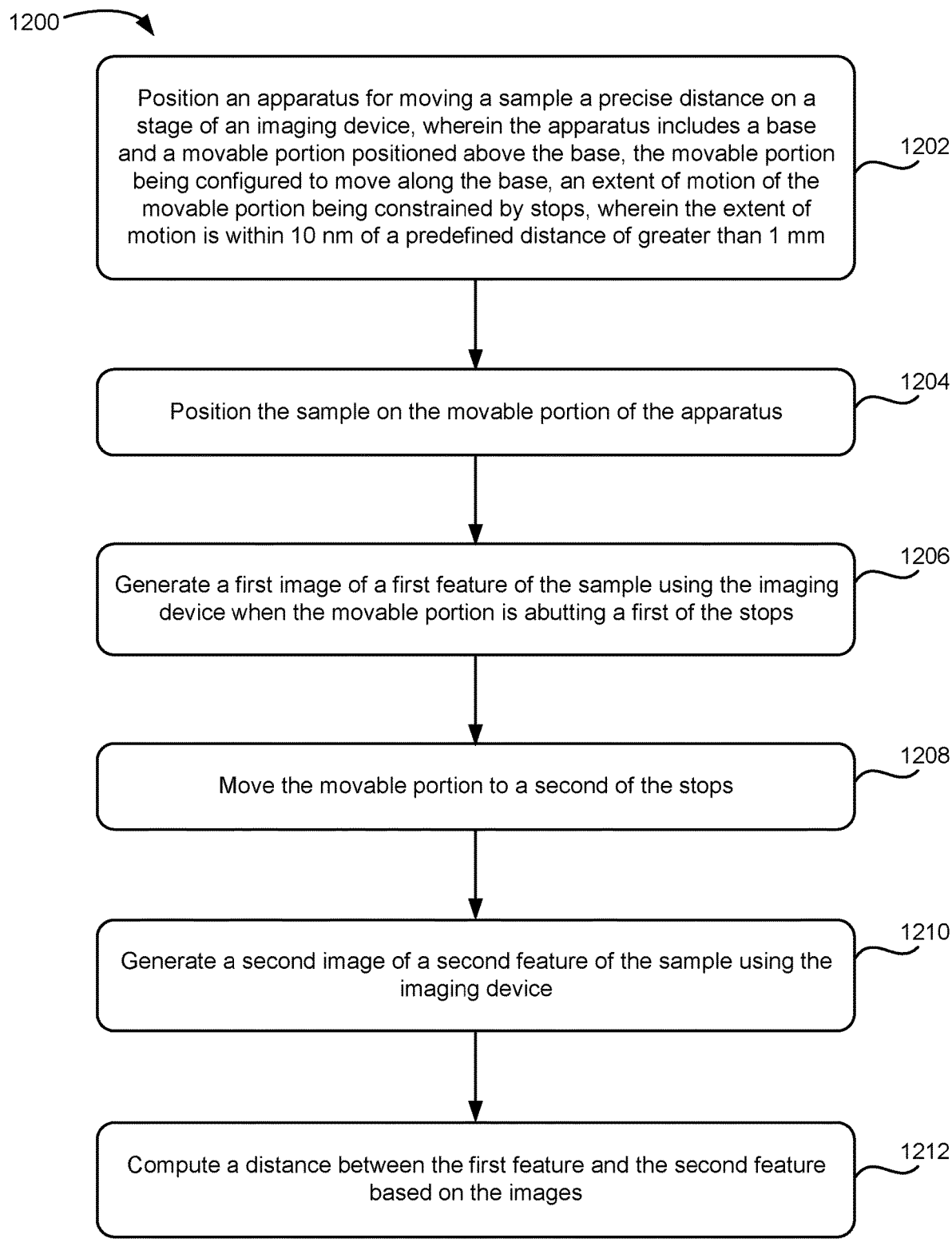
FIG. 12 is a flowchart of a method, according to one embodiment.

FIG. 12 shows a method 1200 for measuring a distance between features of a sample, in accordance with one embodiment. As an option, the present method 1200 may be implemented to devices such as those shown in the other FIGS. described herein. Of course, however, this method 1200 and others presented herein may be used to provide applications which may or may not be related to the illustrative embodiments listed herein. Further, the methods presented herein may be carried out in any desired environment. Moreover, more or less operations than those shown in FIG. 12 may be included in method 1200, according to various embodiments. It should also be noted that any of the aforementioned features may be used in any of the embodiments described in accordance with the various methods.

The method 1200 includes an initial operation 1202 of positioning an apparatus for moving a sample a precise distance on a stage of an imaging device, where the apparatus includes a base and a movable portion positioned above the base, the movable portion being configured to move along the base, an extent of motion of the movable portion being constrained by stops. The extent of motion is within 10 nm of a predefined distance of greater than 1 mm, and preferably within one nanometer. In various approaches, the stops are configured to enable measurement of a predefined distance as the movable portion moves from an initial position to a final position. In some approaches, the movable portion may be configured to move in a linear direction along the base.

Operation 1204 of method 1200 includes positioning the sample on the movable portion of the apparatus. In various approaches, the sample may have two, three, or more features where the precise distance between the features may be measured using the method 1200 described herein. In some approaches, as described above for FIG. 10, the first feature may be positioned on the movable portion in alignment with a computer-generated reference line that may be set according to an initial position of the movable portion in which a stop on the movable portion may have a point of engagement with a stop of a guide. In some approaches, the second feature may be positioned as being aligned with a stop of the movable portion. In some approaches, the point of engagement of the stop and the opposing stop includes the movable portion abutting a stop, the stop on the movable portion abutting a guide, the stop on the movable portion abutting an opposing stop, etc.

Operation 1206 of method 1200 includes generating a first image of a first feature of the sample using the imaging device when the movable portion is abutting a first of the stops. In one approach the image may be generated of the first feature relative to a reference line. In various approaches, the imaging device may be a AFM, MFM, SEM, etc. as would be understood as would be understood by one having ordinary skill in the art upon reading the present descriptions.

Operation 1208 of method 1200 includes moving the movable portion to a second of the stops. In various approaches, moving the movable portion to a second of the stops results in an extent of motion of the movable portion. The extent of motion may be the distance the movable portion moves according to the predefined distance set by the stops. For example, as shown in FIG. 10, the movable portion may be moved until the second stop of the movable portion engages (e.g. abuts, contacts, etc.) with a stop of an opposing component on the base of the apparatus (e.g. guide). In one approach, the movable portion may be moved to a final position. In another approach, the second feature of the sample may be aligned with reference line that was set with the initial position of the first feature of the sample.

Any manner of moving the movable portion to the second position may be used. Preferably, a gentle mechanism is used so as not to disturb the position of the sample on the movable portion. In one approach, the movable portion may be moved with a spring. In another approach the movable portion may be moved along the base using a magnetic motor. In another approach, the movable portion may be moved along the base using an air pressure mechanism. In preferred approaches, the movable portion is moved along the base such that there is minimal force applied to the point of engagement between the stop and the opposing stop. In other approaches, the movable portion may be moved by techniques as would be understood by one having ordinary skill in the art upon reading the present descriptions.

In preferred approaches, the extent of motion may be precise to within 10 nanometers of the predefined distance, preferably one nanometer or less.

Operation 1210 of method 1200 includes generating a second image of a second feature of the sample using the imaging device. In one approach, a second image may be generated of the second feature relative to the reference line.

Operation 1212 of method 1200 includes computing a distance between the first feature and the second feature based on the images. In some approaches, computing a distance between the first feature and the second feature based on the images may include comparing the first image of the first feature with the second image of the second feature.

In some approaches, the computation of the distance may include adjusting the predefined distance with a misregistration, for example, as determined from the comparison of the first image of the first feature with the second image of the second feature. In some approaches, the misregistration may be between sample feature locations in the first image and the second image.

In other approaches, the misregistration may include a misregistration of the first image to a reference line and a misregistration of the second image to the reference line. FIG. 13 shows an example of computing a misregistration relative to a reference line. In the side views of a system 1300, Part (a) of FIG. 13 depicts a first position of the movable portion 1306 with a sample 1008 having feature 1010 to be imaged. The movable portion 1306 is positioned above a base 1304. In some approaches, the base 1304 may be positioned on a stage 1302 portion of the imaging apparatus. The imaging device 1320 generates a first image 1322 (Part (b) of FIG. 13) of the first feature 1010. The first image 1322 may have a reference line 1326 aligned with the first feature 1010 of the sample 1008. The reference line 1326 of the first feature 1010 may correspond to the centerline of the first feature 1010, to some other notable reference mark, an edge of the feature, etc.

Part (c) of FIG. 13 depicts a second position of the movable portion 1306 with the sample 1008 and the imaging of the second feature 1012 by the imaging device 1320. The movable portion 1306 moves in a linear direction (arrow) a predefined distance d to the second feature 1012 under the imaging device 1320. A second image 1324 is generated by the imaging device 1320 of the second feature 1012 as shown in part (d) of FIG. 13. The reference line 1326 relative the first feature 1010 may be offset from the center line 1328 of the second feature 1012. The misregistration 1330 between the reference line 1326 of the first feature 1010 and the center line 1328 of the second feature 1012 allows computation of the precise distance between the two features 1010, 1012 within 10 nm or better. In some approaches, image overlay techniques may be used.

In some approaches, the misregistration between two images may be a pixel displacement. Such pixel displacement may be countable. In some approaches, the two images may be compared using image processing software that may provide computations by image subtraction to determine the pixel displacement between the two images.

In one approach, the imaging device may be an AFM. In another approach, the imaging device may be a MFM. In yet another approach, the imaging device may be a SEM. These approaches are not meant to be limiting in any way, and an imaging device may be used as understood by one skilled in the art.

Figure 14:
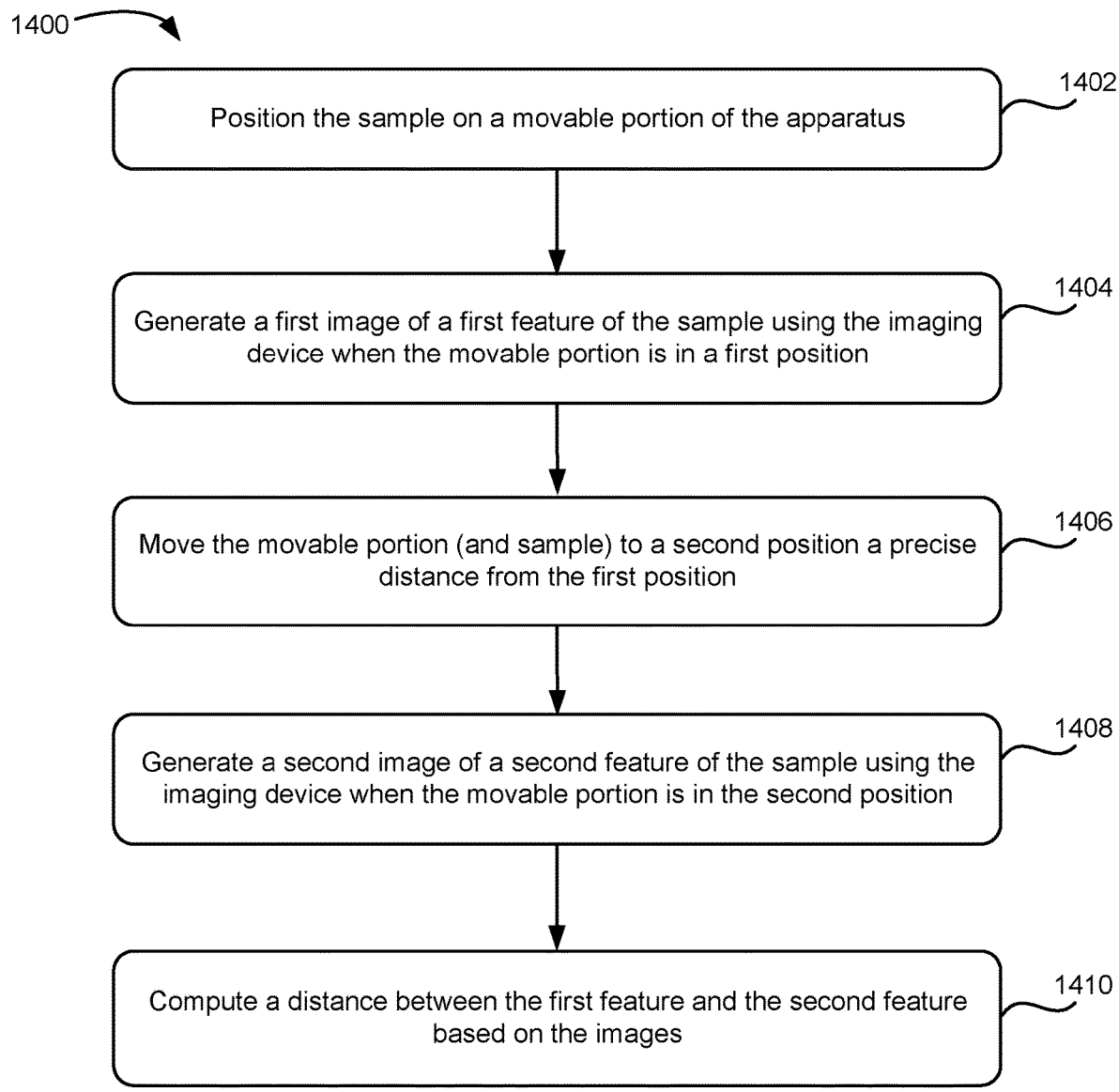
FIG. 14 is a flowchart of a method, according to one embodiment.

FIG. 14 shows a method 1400 for measuring a distance between features of a sample, in accordance with one embodiment. As an option, the present method 1400 may be implemented to devices such as those shown in the other FIGS. described herein. Of course, however, this method 1400 and others presented herein may be used to provide applications which may or may not be related to the illustrative embodiments listed herein. Further, the methods presented herein may be carried out in any desired environment. Moreover, more or less operations than those shown in FIG. 14 may be included in method 1400, according to various embodiments. It should also be noted that any of the aforementioned features may be used in any of the embodiments described in accordance with the various methods.

The method 1400 includes an initial operation 1402 of positioning the sample on the movable portion of the apparatus. In various approaches, the sample may have two, three, or more features where the precise distance between the features may be measured using the method 1400 described herein.

In some approaches, operation 1402 may include an apparatus for moving a sample a precise distance on a stage of an imaging device, where the apparatus includes a base and a movable portion positioned above the base, the movable portion being configured to move along the base, an extent of motion of the movable portion being constrained by stops. The extent of motion is within 10 nm of a predefined distance of greater than 1 mm, and preferably within one nanometer. In various approaches, the stops are configured to enable measurement of a predefined distance as the movable portion moves from an initial position to a final position. In some approaches, the movable portion may be configured to move in a linear direction along the base.

In some approaches, the motion from the first position to the second position may be done under the control of an interferometer.

Operation 1404 of method 1400 includes generating a first image of a first feature of the sample using the imaging device when the movable portion is in a first position. In one approach the image may be generated of the first feature relative to a reference line. In various approaches, the imaging device may be a AFM, MFM, SEM, etc. as would be understood as would be understood by one having ordinary skill in the art upon reading the present descriptions.

Operation 1406 of method 1400 includes moving the movable portion (and the sample) to a second position a precise distance from the first position. In various approaches, moving the movable portion to a second position results in an extent of motion of the movable portion. The extent of motion may be the distance the movable portion moves according to the predefined distance set by the stops.

In preferred approaches, the extent of motion may be precise to within 10 nanometers of the predefined distance, preferably one nanometer or less.

Operation 1408 of method 1400 includes generating a second image of a second feature of the sample using the imaging device when the movable portion is in the second position. In one approach, a second image may be generated of the second feature relative to the reference line.

Operation 1410 of method 1400 includes computing a distance between the first feature and the second feature based on the images. In some approaches, computing a distance between the first feature and the second feature based on the images may include comparing the first image of the first feature with the second image of the second feature.

Figure 15A:
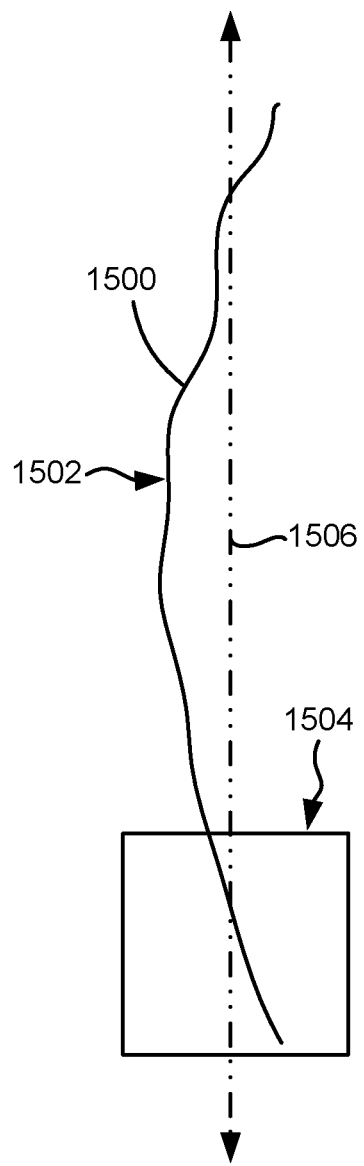
FIGS. 15A-15C are representations of a method for determining deviation from linearity of a reference surface, according to one embodiment.
Figure 15B:
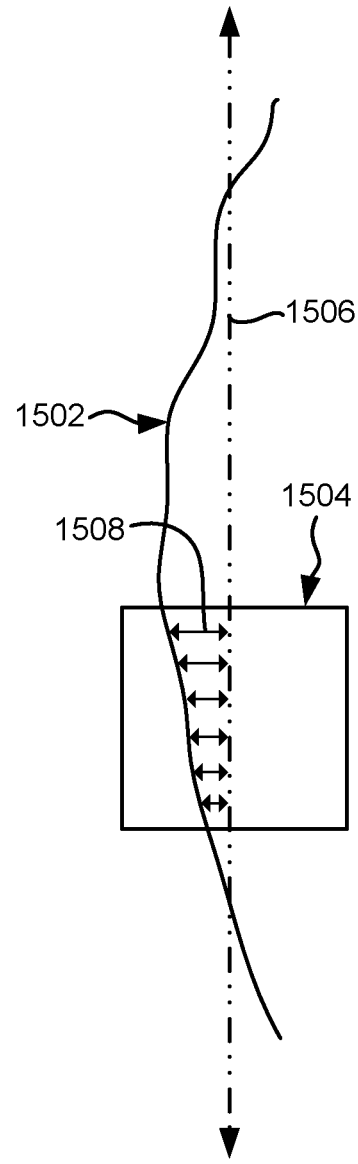
Figure 15C:
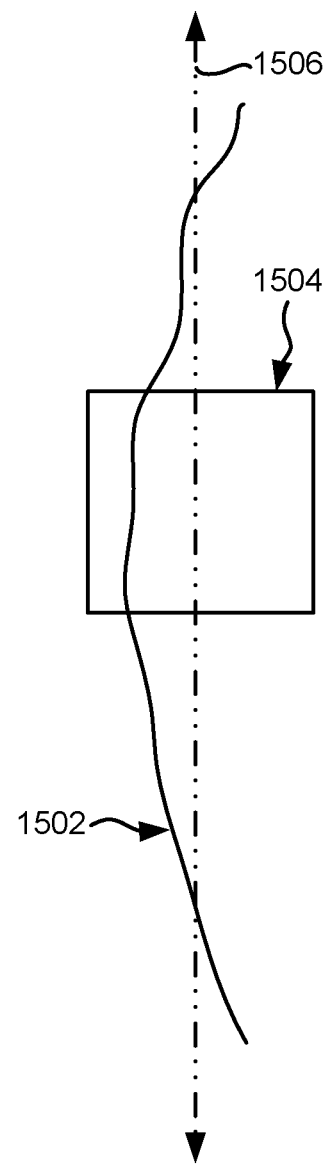

FIGS. 15A-15C depict an extension of the method of FIG. 12, where multiple images are captured between the starting and stopping positions of the movable portion. This technique is useful, for example, for determining whether curvature or other nonlinear feature is present on the sample. In FIG. 15A, an image of the sample 1500 is taken at a first position. The reference edge 1502 is shown within the bounds of the image periphery representation 1504. In FIGS. 15B and 15C, additional images are taken. Because the relative movement is along a straight line, represented by axis of movement 1506, deviation 1508 from linearity of the reference edge 1502 can be determined by examining the images. Thus, by imaging at, for example, known intervals, the images can be compared and the curvature of the reference edge may be extracted. The intervals may be selected, predefined, etc. For example, a worm screw may be used to move the movable portion between the intervals.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a ROM, an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. An apparatus for moving a sample a precise distance in an imaging device, the apparatus comprising:
a base; and
a movable portion positioned above the base and configured to move relative to the base, an extent of motion of the movable portion being constrained by stops,
wherein the extent of motion is within 10 nm of a predefined distance of greater than 1 mm,
wherein the base is configured to fit on a stage of an imaging device.

2. An apparatus as recited in claim 1, wherein the movable portion is a linear motion device, wherein the extent of motion is defined by the predefined distance between two stops.

3. An apparatus as recited in claim 1, wherein the movable portion has a feature configured to change a position of the sample to a precise location.

4. An apparatus as recited in claim 1, wherein stops are comprised of a material with a hardness on the Mohr scale of at least 9.

5. An apparatus as recited in claim 1, wherein the stops are comprised of a material selected from the group consisting of corundum, invar alloy, and hardened steel.

6. An apparatus as recited in claim 1, wherein the stops are comprised of a material with a thermal expansion coefficient near zero at room temperature.

7. An apparatus as recited in claim 1, wherein the movable portion is comprised of a material with a thermal expansion coefficient near zero at room temperature.

8. An apparatus as recited in claim 1, comprising a temperature sensor for detecting a temperature in an immediate vicinity of the apparatus.

9. An apparatus as recited in claim 1, wherein at least one of the stops is adjustable for changing the extent of motion of the movable portion.

10. An apparatus as recited in claim 1, comprising an imaging device.

11. An apparatus for moving a sample a precise distance in an imaging device, the apparatus comprising:
a base; and
a movable portion positioned above the base and configured to move relative to the base,
an extent of motion of the movable portion being constrained by stops,
wherein the extent of motion is within 10 nm of a predefined distance of greater than 1 mm,
wherein the base is configured to fit on a stage of at least one imaging device selected from the group consisting of: an atomic force microscope, a magnetic force microscope, a scanning electron microscope, an ultraviolet microscope, and an optical microscope.

12. An apparatus as recited in claim 11, comprising the at least one imaging device.

13. An apparatus as recited in claim 11, wherein the movable portion is a linear motion device, wherein the extent of motion is defined by the predefined distance between two stops.

14. An apparatus as recited in claim 11, wherein the movable portion has a feature configured to position the sample in a precise location, wherein the movable portion sets a position of the stops.

15. An apparatus as recited in claim 11, wherein stops are comprised of a material with a hardness on the Mohr scale of at least 9.

16. An apparatus as recited in claim 11, wherein the stops are comprised of a material selected from the group consisting of corundum, invar alloy, and hardened steel.

17. An apparatus as recited in claim 11, wherein the stops are comprised of a material with a thermal expansion coefficient near zero at room temperature.

18. An apparatus as recited in claim 11, wherein the movable portion is comprised of a material with a thermal expansion coefficient near zero at room temperature.

19. An apparatus as recited in claim 11, comprising a temperature sensor for detecting a temperature in an immediate vicinity of the apparatus.

20. An apparatus for moving a sample a precise distance in an imaging device, the apparatus comprising:

a base;

a movable portion positioned above the base and configured to move relative to the base, an extent of motion of the movable portion being constrained by stops, wherein the extent of motion is within 10 nm of a predefined distance of greater than 1 mm; and at least one imaging device selected from the group consisting of: an atomic force microscope, a magnetic force microscope, a scanning electron microscope, an ultraviolet microscope, and an optical microscope.

* * * * *